US011005499B2

(12) United States Patent
Kim et al.

(10) Patent No.: US 11,005,499 B2
(45) Date of Patent: May 11, 2021

(54) LDPC DECODER, SEMICONDUCTOR MEMORY SYSTEM, AND OPERATING METHOD THEREOF

(71) Applicant: SK hynix Inc., Icheon-si (KR)

(72) Inventors: Dae-Sung Kim, Icheon-si (KR);
Soon-Young Kang, Yongin-si (KR);
Bo-Seok Jeong, Incheon (KR)

(73) Assignee: SK hynix Inc., Icheon-si (KR)

( * ) Notice: Subject to any disclaimer, the term of this patent is extended or adjusted under 35 U.S.C. 154(b) by 22 days.

(21) Appl. No.: 16/660,214

(22) Filed: Oct. 22, 2019

(65) Prior Publication Data

US 2020/0162108 A1 May 21, 2020

(30) Foreign Application Priority Data

Nov. 19, 2018 (KR) .......................... 10-2018-0142690

(51) Int. Cl.
*H03M 13/00* (2006.01)
*H03M 13/11* (2006.01)
(Continued)

(52) U.S. Cl.
CPC ..... *H03M 13/1131* (2013.01); *G06F 11/1012* (2013.01); *G06F 11/1068* (2013.01); *H03M 13/1575* (2013.01); *H03M 13/3707* (2013.01)

(58) Field of Classification Search
None
See application file for complete search history.

(56) References Cited

U.S. PATENT DOCUMENTS 8,347,195 B1 * 1/2013 Varnica .............. H03M 13/1128
714/785
8,966,339 B1 * 2/2015 Lu ........................ H03M 13/116
714/758
(Continued)

FOREIGN PATENT DOCUMENTS

| KR | 10-1296773 | 8/2013 |
| KR | 10-2018-0010448 | 1/2018 |

OTHER PUBLICATIONS

S. Kang, J. Moon, J. Ha and J. Shin, "Breaking the Trapping Sets in LDPC Codes: Check Node Removal and Collaborative Decoding," in IEEE Transactions on Communications, vol. 64, No. 1, pp. 15-26, Jan. 2016, doi: 10.1109/TCOMM.2015.2498161. (Year: 2015).*

*Primary Examiner* — Daniel F. McMahon
(74) *Attorney, Agent, or Firm* — Perkins Coie LLP

(57) ABSTRACT

A semiconductor memory system includes: a semiconductor memory device to store a codeword; and a low-density parity check (LDPC) decoder to decode the codeword, based on a parity check matrix, to generate a decoded codeword, wherein the LDPC decoder includes: a selector to select one or more sub-matrices that share the same layer index of the parity check matrix, and select variable nodes corresponding to columns included in the selected one or more sub-matrices based on a threshold value and a number of unsatisfied check nodes (UCNs) connected to the selected variable nodes; a variable node updater to update decision values of variable nodes corresponding to all columns included in the parity check matrix; a syndrome checker to determine whether decoding the codeword has been performed successfully or not; and a check node updater to update a backup syndrome, the threshold value, and a size of a processing unit.

24 Claims, 16 Drawing Sheets

(51) Int. Cl.
　　　*H03M 13/15*　　　(2006.01)
　　　*G06F 11/10*　　　(2006.01)
　　　*H03M 13/37*　　　(2006.01)

(56) References Cited

U.S. PATENT DOCUMENTS

| | | | | |
|---|---|---|---|---|
| 2010/0287440 | A1* | 11/2010 | Alrod | H03M 13/616 |
| | | | | 714/752 |
| 2011/0320902 | A1* | 12/2011 | Gunnam | H03M 13/1128 |
| | | | | 714/752 |
| 2012/0005551 | A1* | 1/2012 | Gunnam | H03M 13/6306 |
| | | | | 714/752 |
| 2012/0185744 | A1* | 7/2012 | Varnica | H03M 13/1131 |
| | | | | 714/752 |
| 2016/0274971 | A1* | 9/2016 | Kang | G06F 11/1012 |
| 2018/0062666 | A1 | 3/2018 | Zhang et al. | |
| 2019/0158116 | A1* | 5/2019 | Lee | H03M 13/116 |
| 2020/0099403 | A1* | 3/2020 | Kim | H03M 13/1105 |

* cited by examiner

<IDEAL>

- After 1 iteration
v = ( 0  1  1  0  1  0  0  0  1  1 )

$$H\underline{v}^t = \begin{pmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{pmatrix} \begin{pmatrix} 0 \\ 1 \\ 1 \\ 0 \\ 1 \\ 0 \\ 0 \\ 0 \\ 1 \\ 1 \end{pmatrix} = \begin{pmatrix} 0 \\ 1 \\ 0 \\ 0 \\ 0 \end{pmatrix} \neq \underline{0}$$ → Perform next iteration Syndrome check

LDPC DECODER, SEMICONDUCTOR MEMORY SYSTEM, AND OPERATING METHOD THEREOF

CROSS-REFERENCE TO RELATED APPLICATIONS

This patent document claims priority to Korean Patent Application No. 10-2018-0142690, filed on Nov. 19, 2018, which is incorporated herein by reference in its entirety for all purposes.

TECHNICAL FIELD

Exemplary embodiments of the disclosed technology generally relate to semiconductor memory systems, and more particularly, to error correction in the semiconductor memory systems.

BACKGROUND

In general, semiconductor memory devices are classified into volatile memory devices (e.g., Dynamic Random Access Memory (DRAM) and Static RAM (SRAM)) and non-volatile memory devices (e.g., Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.)

A volatile memory device loses the data stored therein when power supply thereto is interrupted, whereas a non-volatile memory device retains data stored therein even when power supply thereto is interrupted. Flash memory devices are widely used as a storage medium in a computer system because of its high program speed, low power consumption and large data storage capacity.

SUMMARY

Embodiments of the presently disclosed technology are directed to a memory controller, a semiconductor memory system, and an operation method thereof that may quickly and accurately decode data stored in a memory cell.

In accordance with an embodiment of the presently disclosed technology, a semiconductor memory system includes: a semiconductor memory device to store a codeword comprising a plurality of sub-matrices; and a low-density parity check (LDPC) decoder to decode the codeword, based on a parity check matrix, to generate a decoded codeword, wherein the LDPC decoder includes: a selector to select one or more sub-matrices of the plurality of sub-matrices that share the same layer index of the parity check matrix, and select variable nodes corresponding to columns included in the selected one or more sub-matrices based on a threshold value and a number of unsatisfied check nodes (UCNs) connected to the selected variable nodes; a variable node updater to update decision values of variable nodes corresponding to all columns included in the parity check matrix by inverting decision values of the selected variable nodes, wherein inverting a decision value comprises flipping a zero value to a one value, or a one value to a zero value; a syndrome checker to determine whether decoding the codeword has been performed successfully or not by multiplying the updated decision values of the variable nodes by the parity check matrix; and a check node updater to update a backup syndrome, the threshold value, and a size of a processing unit upon a determination that a sub-iteration operation has been performed Im times, wherein the size of the processing unit is P×Im, wherein Im is a maximum sub-iteration count, wherein P is the number of variable nodes that may perform an LDPC decoding operation in parallel, and wherein the sub-iteration operation comprises selecting the one or more sub-matrices, updating the decision values of variable nodes, and determining whether decoding the codeword has been performed successfully or not.

In accordance with another embodiment of the presently disclosed technology, a method for operating a semiconductor memory system, which stores a codeword comprising a plurality of sub-matrices, includes: selecting one or more sub-matrices of the plurality of sub-matrices that share the same layer index of a parity check matrix and selecting variable nodes corresponding to columns included in the selected one or more sub-matrices based on a threshold value and a number of unsatisfied check nodes (UCNs) connected to the selected variable nodes; updating decision values of variable nodes corresponding to all columns included in the parity check matrix by inverting decision values of the selected variable nodes, wherein inverting a decision value comprises flipping a zero value to a one value, or a one value to a zero value; determining whether decoding the codeword has been performed successfully or not by multiplying the updated decision values of the variable nodes by the parity check matrix; and updating a backup syndrome, the threshold value, and a size of a processing unit upon a determination that a sub-iteration operation has been performed Im times, wherein the size of the processing unit is P×Im, wherein Im is a maximum sub-iteration count, wherein P is the number of variable nodes that may perform an LDPC decoding operation in parallel, and wherein the sub-iteration operation comprises the selecting the one or more sub-matrices, the updating the decision values, and determining whether decoding the codeword has been performed successfully or not.

In accordance with yet another embodiment of the presently disclosed technology, a semiconductor memory system includes: a semiconductor memory device suitable for storing a codeword which is an encoded data; and a Low-Density Parity Check (LDPC) decoder suitable for decoding the codeword stored in the semiconductor memory device through a parity check matrix which is formed of sub-matrices so as to generate a decoded data, wherein the LDPC decoder includes: a variable node selecting unit suitable for selecting the sub-matrices that share the same layer of the parity check matrix, and performing a variable node selecting operation of selecting variable nodes corresponding to columns included in each of the selected sub-matrices as many as a basic processing unit; a variable node updating unit suitable for performing a variable node updating operation of updating decision values of the variable nodes corresponding to all the columns included in the parity check matrix by inverting decision values of the selected variable nodes; a syndrome checking unit suitable for performing a syndrome checking operation to determine whether a decoding operation of decoding the codeword is performed successfully or not by multiplying the updated decision values of the variable nodes by the parity check matrix; and a check node updating unit suitable for updating the backup syndrome, a threshold value, and the processing unit whenever the variable nodes as many as the processing unit are updated by repeating one sub-iteration unit, which is formed of the variable node selecting operation, the variable node updating operation, and the syndrome checking operation, as many times as the maximum sub-iteration count.

In accordance with yet another embodiment of the presently disclosed technology, a method for operating a semiconductor memory system, includes: selecting the sub-matrices that share the same layer of the parity check matrix and performing a variable node selecting operation of selecting variable nodes corresponding to columns included in each of the selected sub-matrices as many as a basic processing unit; performing a variable node updating operation of updating decision values of the variable nodes corresponding to all the columns included in the parity check matrix by inverting decision values of the selected variable nodes; performing a syndrome checking operation to determine whether a decoding operation of decoding a codeword is performed successfully or not by multiplying the updated decision values of the variable nodes by the parity check matrix; and updating the backup syndrome, a threshold value, and the processing unit whenever the variable nodes as many as the processing unit are updated by repeating one sub-iteration unit, which is formed of the variable node selecting operation, the variable node updating operation, and the syndrome checking operation, as many times as the maximum sub-iteration count.

DETAILED DESCRIPTION

In a non-volatile memory device (e.g., a flash memory device), states of data of each memory cell depend on the number of bits that the memory cell can program. A memory cell storing 1-bit of data per cell is called a single-bit cell or a single-level cell (SLC). A memory cell storing multi-bit data (e.g., 2 or more bits of data) per cell is called a multi-bit cell, a multi-level cell (MLC) or a multi-state cell. The MLC is advantageous for a high level of integration. However, as the number of bits programmed in each memory cell increases, the reliability decreases and the read failure rate increases.

For example, when k bits are programmed in a memory cell, one of $2^k$ threshold voltages is formed in the memory cell. Due to the minute differences between the electrical characteristics of memory cells, the threshold voltages of memory cells programmed for the same data form threshold voltage distributions. The threshold voltage distributions correspond to $2^k$ data values representing k-bits of information, respectively.

However, the voltage window available for the threshold voltage distributions is finite. Therefore, as the value k increases, the distance between the threshold voltage distributions decreases and the neighboring threshold voltage distributions overlap each other. As the neighboring threshold voltage distributions overlap each other, reading data may result in several or several tens of bit errors.

Figure 1:
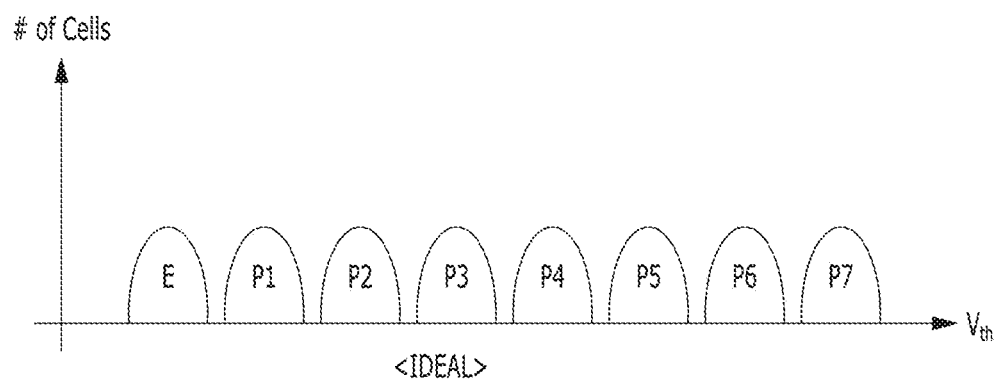
FIG. 1 is an example threshold voltage distribution schematically illustrating program and erase states of a 3-bit multi-level cell (3-bit MLC) non-volatile memory device.

FIG. 1 illustrates an example threshold voltage distribution of program and erase states for a 3-bit multi-level cell (3-bit MLC) non-volatile memory device.

Figure 2:
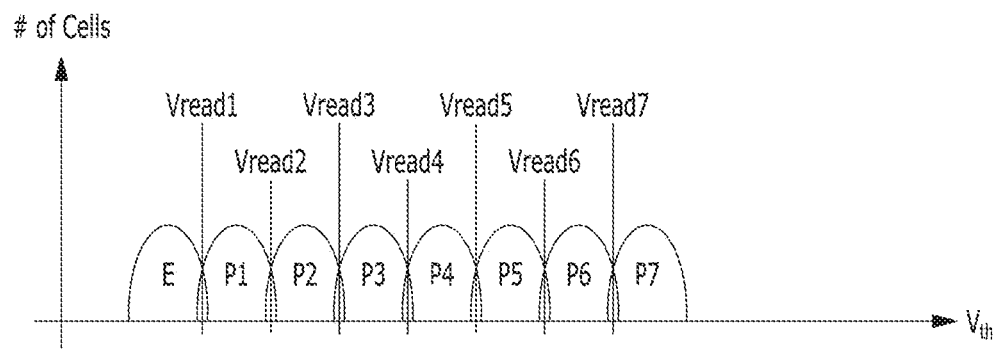
FIG. 2 is an example threshold voltage distribution schematically illustrating program and erase states due to characteristic deterioration of a 3-bit MLC non-volatile memory device.

FIG. 2 illustrates an example threshold voltage distribution of program and erase states as a result of the characteristic deterioration of the 3-bit MLC non-volatile memory device.

In the MLC non-volatile memory device, e.g., the MLC flash memory device capable of storing k-bit data in a single memory cell, the memory cell may have one of $2^k$ threshold voltage distributions. For example, the 3-bit MLC has one of 8 threshold voltage distributions.

The threshold voltages of memory cells programmed for the same data form threshold voltage distributions due to characteristic differences between memory cells. In the 3-bit MLC non-volatile memory device, as illustrated in FIG. 1, the threshold voltage distributions are formed in correspondence with the data states including 7 program states 'P1' to 'P7' and an erase state 'E'.

FIG. 1 shows an ideal case in which the threshold voltage distributions do not overlap and are separated by read voltage margins. Referring to the flash memory example of FIG. 2, the memory cell may experience charge loss when electrons trapped at a floating gate or tunnel oxide film are discharged over time. Such charge loss can accelerate when the tunnel oxide film deteriorates by iterative program and erase operations. The charge loss results in a decrease in the threshold voltages of memory cells. For example, as illustrated in FIG. 2, the threshold voltage distribution can be shifted left due to charge loss.

Further, program disturbance, erase disturbance and/or back pattern dependency also cause increases in threshold voltages. As characteristics of memory cells deteriorate, neighboring threshold voltage distributions can overlap, as illustrated in FIG. 2.

Once neighboring threshold voltage distributions overlap, read data can include a significant number of errors when a particular read voltage is applied to a selected word line. For example, when a sensed state of a memory cell according to a read voltage Vread3 applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighboring threshold voltage distributions overlap, the memory cell actually having the third program state 'P3' can be erroneously determined to have the second program state 'P2'. Thus, when the neighboring threshold voltage distributions overlap as illustrated in FIG. 2, read data can include a significant number of errors.

Embodiments of the disclosed technology advantageously provide methods and devices to improve reading data stored in memory cells of a semiconductor memory device.

Throughout the disclosure, like reference numerals refer to like parts throughout the various figures and embodiments of the presently disclosed technology.

Figure 3:
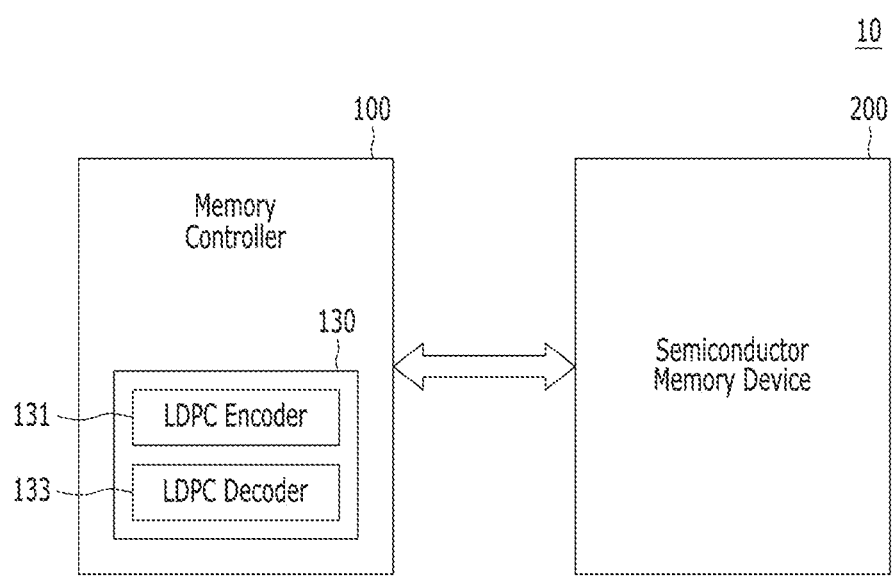
FIG. 3 is a block diagram schematically illustrating an example of a semiconductor memory system in accordance with an embodiment of the presently disclosed technology.

FIG. 3 is a block diagram schematically illustrating an exemplary semiconductor memory system 10 in accordance with an embodiment of the presently disclosed technology.

Figure 4A:
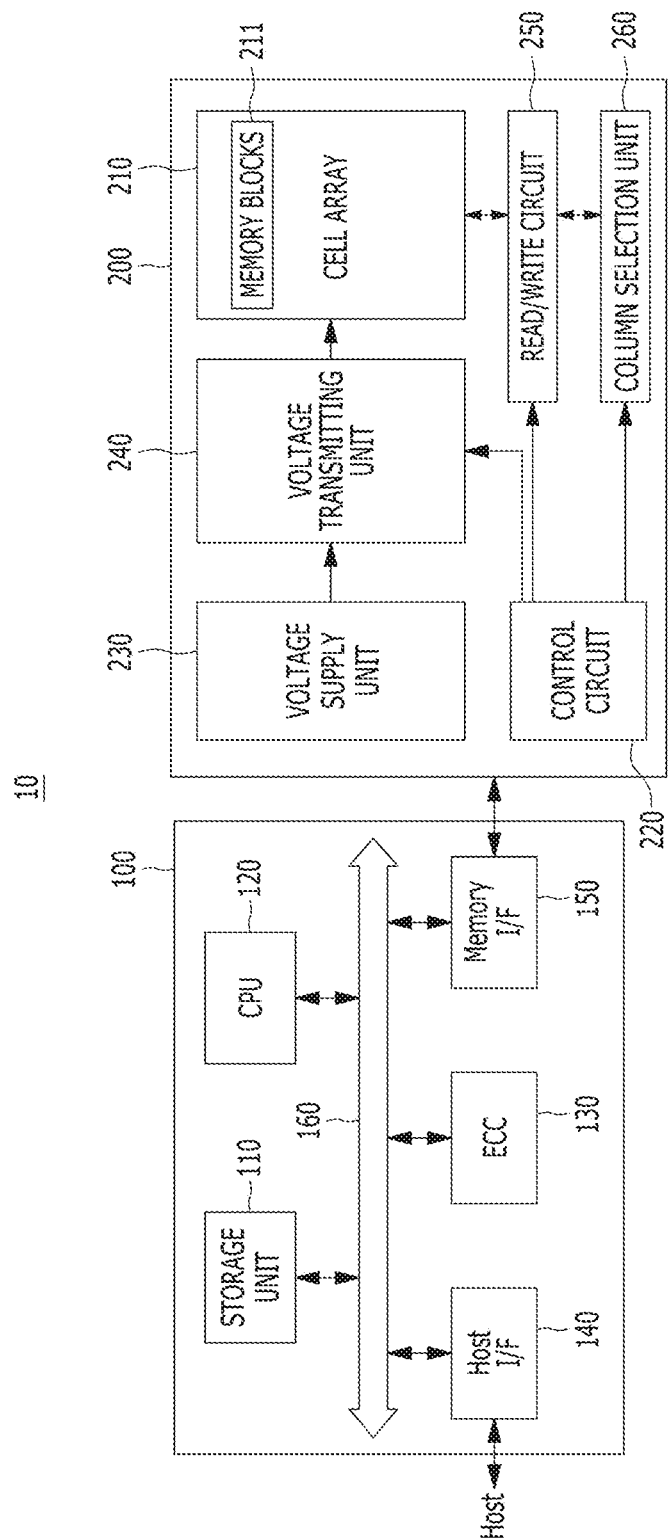
FIG. 4A is a block diagram illustrating an example semiconductor memory system shown in FIG. 3.

FIG. 4A is a block diagram illustrating the exemplary semiconductor memory system 10 illustrated in FIG. 3.

Figure 4B:
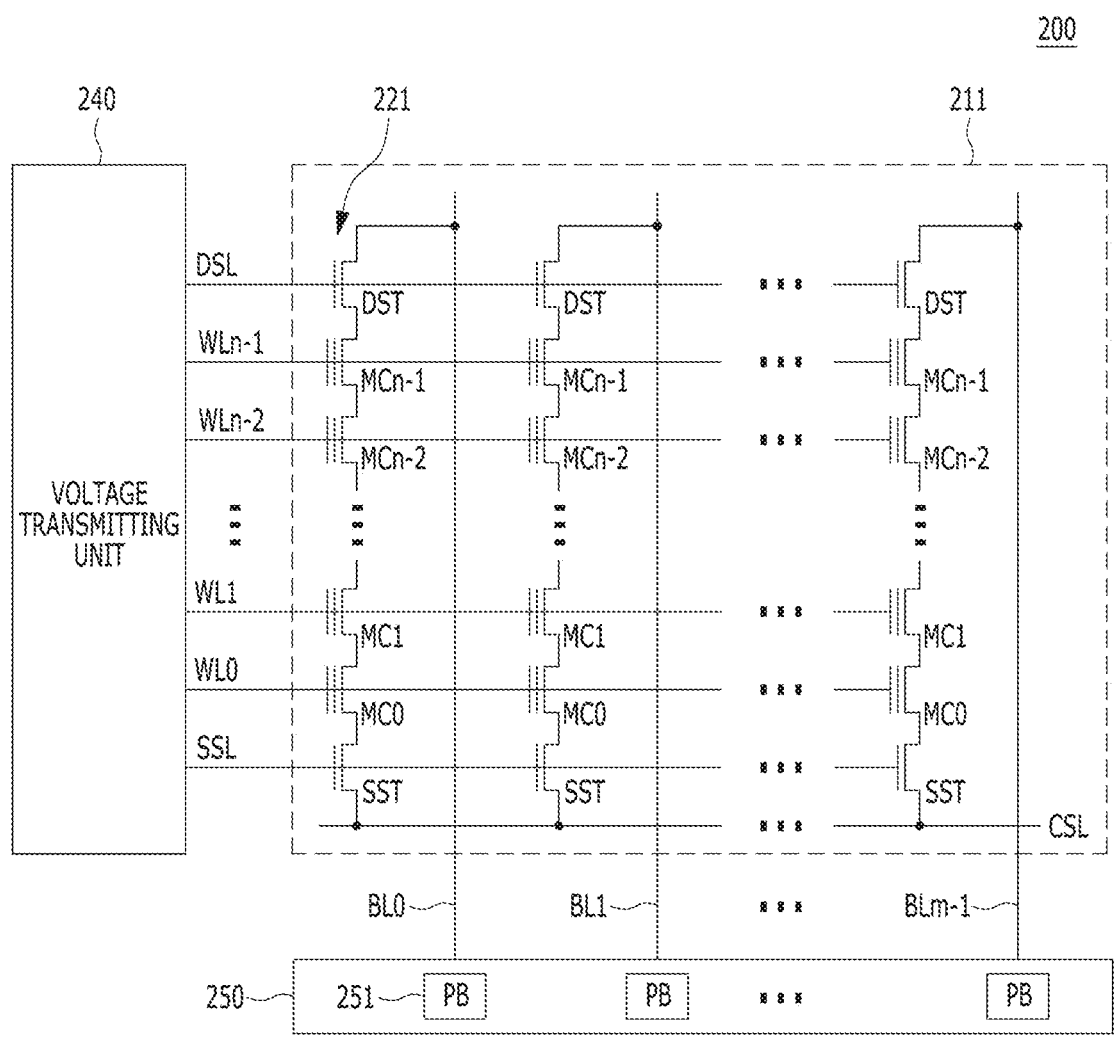
FIG. 4B is a circuit diagram illustrating an example memory block shown in FIG. 4A.

FIG. 4B is a circuit diagram of an exemplary memory block 211 illustrated in FIG. 4A.

Figure 5:
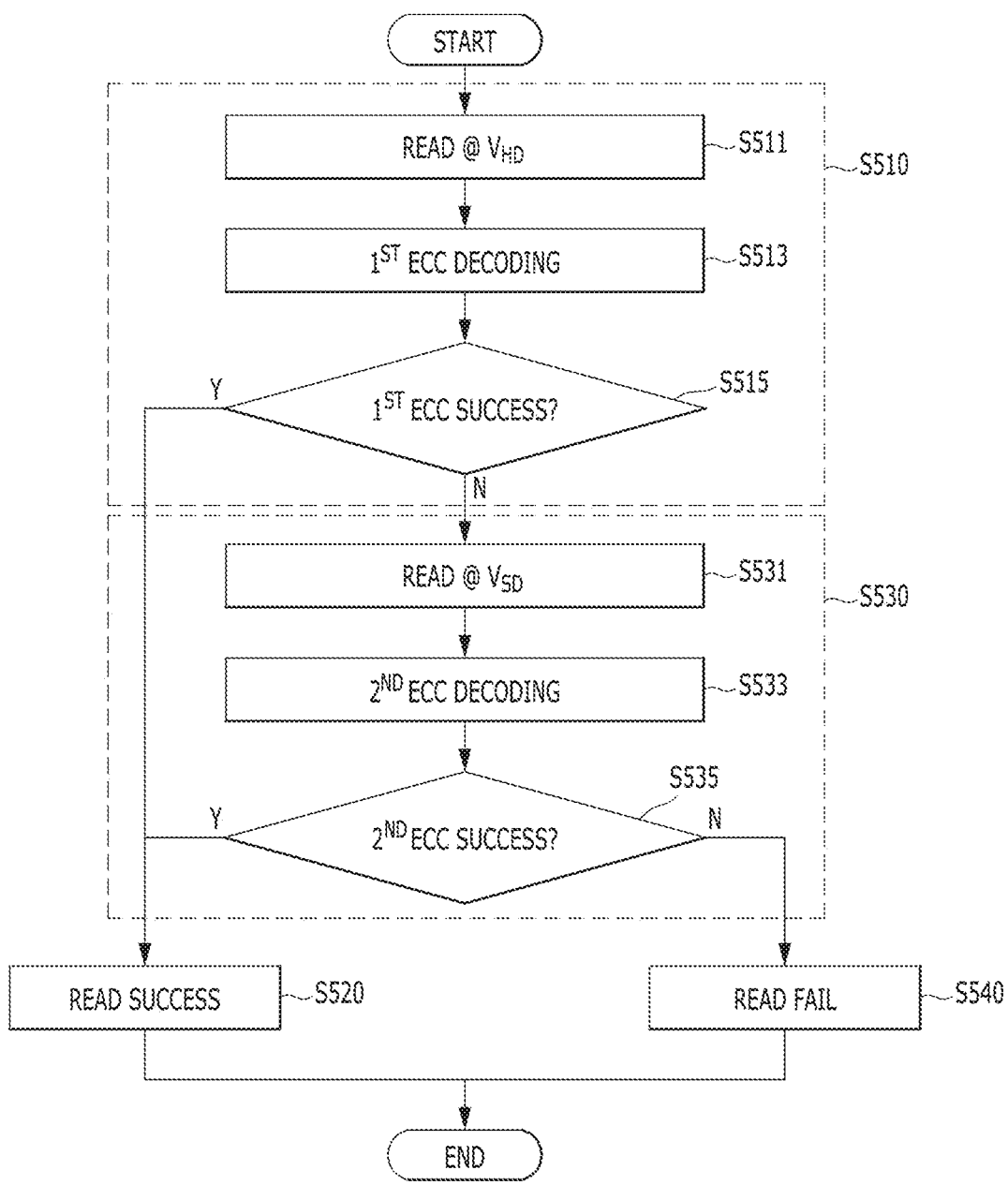
FIG. 5 is a flowchart illustrating an example operation of a memory controller shown in FIG. 4A.

FIG. 5 is a flowchart illustrating an example of the operation of a memory controller 100 included in the semiconductor memory system 10.

Referring to the exemplary embodiments illustrated in FIGS. 3 to 5, the semiconductor memory system 10 can include a semiconductor memory device 200 and the memory controller 100.

In some embodiments, the semiconductor memory device 200 can perform one or more of erase, program, and read operations under the control of the memory controller 100. The semiconductor memory device 200 may receive a command (CMD), an address (ADDDR) and data (DATA) through input/output lines. The semiconductor memory device 200 may receive power (PWR) through a power line and a control signal (CTRL) through a control line. The control signal may include a command latch enable (CLE) signal, an address latch enable (ALE) signal, a chip enable (CE) signal, a write enable (WE) signal, a read enable (RE) signal, and so on.

In some embodiments, the memory controller 100 may control overall operations of the semiconductor memory device 200. The memory controller 100 may include an LDPC unit 130 for correcting error bits. The LDPC unit 130 may include an LDPC encoder 131 and an LDPC decoder 133.

The LDPC encoder 131 may perform an encoding operation on data to be programmed into the semiconductor memory device 200, and output data that includes additional parity bits. The parity bits may be stored in the semiconductor memory device 200.

The LDPC decoder 133 may perform error correction decoding on data read from the semiconductor memory device 200. The LDPC decoder 133 may determine whether the error correction decoding is successful, and may output an instruction signal based on the determination result. The LDPC decoder 133 may correct error bits of data using the parity bits generated by the LDPC encoding operation.

In some embodiments, when the number of error bits exceeds error correction capacity of the LDPC unit 130, the LDPC unit 130 may not correct the error bits. In this case, the LDPC unit 130 may generate an error correction fail signal.

In some embodiments, the LDPC unit 130 may include one or more circuits, systems, or devices for error correction. The LDPC code may be a binary LDPC code or a non-binary LDPC code.

In accordance with an embodiment of the presently disclosed technology, the LDPC unit 130 may perform an error bit correcting operation using either hard decision read data, soft decision read data or a combination of hard and soft decision read data.

In some embodiments, the memory controller 100 and the semiconductor memory device 200 may be integrated in a single semiconductor device. For example, the memory controller 100 and the semiconductor memory device 200 may be integrated in a single semiconductor device such as a solid-state drive (SSD) The solid state drive may include a storage device for storing data in a semiconductor memory. For example, when the semiconductor memory system 10 is used in an SSD, the operating speed of a host (not shown) coupled to the semiconductor memory system 10 may improve.

In some embodiments, the memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CO card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the semiconductor memory system may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Referring to FIG. 4A, the memory controller 100 may include a storage unit 110, a CPU 120, the LDPC unit 130, a host interface 140, a memory interface 150 and a system bus 160. The storage unit 110 may operate as a working memory of the CPU 120.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The LDPC unit 130 may detect and correct errors included in the data read from the semiconductor memory device 200. The memory interface 150 may interface with the semiconductor memory device 200. In some embodiments, the LDPC encoder 131 and the LDPC decoder 133 may be implemented as different and independent components. In other embodiments, and as illustrated in FIG. 4A, the LDPC unit 130 may include both of the LDPC encoder 131 and the LDPC decoder 133. The CPU 120 may perform various control operations.

In accordance with an exemplary embodiment of the presently disclosed technology, during the program operation, the LDPC unit 130 may perform an LDPC encoding operation on the original data which is to be programmed to the semiconductor memory device 200. In such case, during the read operation, the LDPC unit 130 may perform an LDPC decoding to the LDPC-encoded data or a codeword, which is stored in the semiconductor memory device 200.

The LDPC unit 130 may restore the original data, which is data before the LDPC encoding operation of the LDPC unit 130 during the program operation, by performing the LDPC decoding operation to the LDPC-encoded data or the codeword stored in the semiconductor memory device 200.

As discussed later with reference to FIG. 5, the read operation on the data stored in the semiconductor memory device 200 may include a hard decision read operation of step S511 and a soft decision read operation of step S531. During the hard decision read operation, data may be read from the semiconductor memory device 200 according to a hard decision read voltage $V_{HD}$. During the soft decision read operation, data may be read from the semiconductor memory device 200 according to soft decision read voltages $V_{SD}$, which have different voltages than the hard decision read voltage $V_{HD}$. For example, an additional read operation according to the soft decision read voltages $V_{SD}$ may be performed to the memory cell, which is read according to the hard decision read voltage $V_{HD}$.

The LDPC-encoded data or the codeword, which is stored in the semiconductor memory device 200 and is read through the hard decision read operation, may be decoded back to the original data by the LDPC unit 130.

In some embodiments, the soft decision read operation is an operation that generates a log-likelihood ratio (LLR), which provides the reliability of the hard decision read data read through the hard decision read operation, according to the soft decision read voltages $V_{SD}$ rather than just the read operation on data stored in the semiconductor memory device 200.

The LDPC unit 130 may perform the LDPC decoding operation using the LLR. The LDPC unit 130 may detect and correct the error of the LDPC-encoded data or the codeword read from the semiconductor memory device 200 using the LLR.

The semiconductor memory device 200 may include a memory cell array 210, a control circuit 220, a voltage supply unit 230, a voltage transmitting unit 240, a read/write circuit 250, and a column selection unit 260.

The memory cell array 210 may include a plurality of memory blocks 211. User data may be stored in the memory block 211.

Referring to FIG. 4B, the memory block 211 may include a plurality of cell strings 221 coupled to bit lines BL0 to BLm-1, respectively. The cell string 221 of each column may include one or more drain selection transistors (DST) and one or more source selection transistors (SST). A plurality of memory cells or memory cell transistors may be serially coupled between the selection transistors DST and SST. Each of the memory cells MC0 to MCn-1 may include a multi-level cell (MLC) storing data information of multiple bits in each cell. The cell strings 221 may be electrically coupled to the corresponding bit lines BL0 to BLm-1, respectively.

The example in FIG. 4B illustrates a memory block 211 comprising a NAND-type flash memory cell. However, the memory block 211 of the semiconductor memory device 200 is not limited to being NAND flash memory, but may comprise NOR-type flash memory, hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operations related to program, erase, and read operations of the semiconductor memory device 200.

The voltage supply unit 230 may provide word line voltages, for example, a program voltage, a read voltage, and a pass voltage, to the respective word lines according to an operation mode, and may provide a voltage to be supplied to a bulk, for example, a well region in which the memory cells are formed. A voltage generating operation of the voltage supply circuit 230 may be performed under control of the control circuit 220.

The voltage supply unit 230 may generate a plurality of variable read voltages for generating a plurality of read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply unit 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During the normal read operation, the column selection unit 260 may output the data read from the read/write circuit 250 to the outside, for example, to the memory controller 100, based on column address information. On the other hand, during the verification read operation, the read data may be provided to a pass/fail verification circuit (not illustrated in FIG. 4A) included in the semiconductor memory device 200, and be used for determining whether a program operation of the memory cell succeeds.

During the program operation, the read/write circuit 250 may operate as a write driver for driving the bit lines according to data to be stored in the memory cell array 210. During the program operation, the read/write circuit 250 may receive the data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIGS. 4A and 5, the operation of the memory controller 100 may include a hard decision decoding step S510, and may additionally include a soft decision decoding step S530. According to some embodiments of the presently disclosed technology, the soft-decision decoding step of the step S530 may be repeatedly performed based on the number of times that a read operation is performed and the precision information of the soft read data. A target data of the hard and soft decision decoding steps S510 and S530, or the data stored in the semiconductor memory device 200 may be the LDDC-encoded data or the codeword, which is LDPC-encoded by LDPC unit 130.

For example, the hard decision decoding step S510 may be a hard decision LDPC, decoding step. For example, it may include a hard decision read data of predetermined length, which is read from a memory cell of the memory block 211 according to the hard decision read voltage $V_{HD}$. The hard decision decoding step S510 may include steps S511 to S515.

For example, the soft decision decoding step S530 may be a step of a soft decision LDPC decoding for the hard decision read data. In an example, this includes forming soft decision read data according to soft decision read voltages $V_{SD}$ around the hard decision read voltage $V_{HD}$ when the hard decision LDPC decoding of the hard decision decoding step S510 finally fails. The soft decision decoding step S530 may include steps S531 to S535.

As described above, at step S511 of the hard decision read step, the hard decision read data may be read from the semiconductor memory device 200 according to the hard decision read voltage $V_{HD}$. The memory controller 100 may provide a read command and an address to the semiconductor memory device 200. The semiconductor memory device 200 may read the hard decision read data therefrom according to the hard decision read voltage $V_{HD}$ in response to the read command and the address. The read hard decision read data may be provided to the memory controller 100.

At step S513, the hard decision LDPC decoding as the hard decision decoding may be performed. The LDPC unit 130 may perform the hard decision LDPC decoding to the hard decision read data, which is read from the semiconductor memory device 200 according to the hard decision read voltage $V_{HD}$ by using the error correction code.

At step S515, it may be determined whether the hard decision LDPC decoding succeeds or fails. For instance, at step S515, it may be determined whether an error of the hard decision read data, on which the hard decision LDPC decoding is performed at step S513, is corrected. For example, the memory controller 100 may determine whether an error of the hard decision read data is corrected by using the hard decision read data and a parity check matrix. For example, when the multiplication of the hard-decision LDPC-decoded hard-decision data and the parity check matrix is a zero vector ('0'), the hard-decision LDPC-decoded hard-decision data may be determined to be correct data. Conversely, when the product of the hard-decision LDPC-decoded hard-decision data and the parity check matrix is not the zero vector ('0'), the hard-decision LDPC-decoded hard-decision data may be determined to be incorrect data.

When it is determined that the hard decision read data has been corrected as the result of step S515, it is determined at step S520 that the read operation according to hard decision read voltage $V_{HD}$ at step S511 is successful and the operation of the memory controller 100 may end. The hard decision read data, on which the hard decision LDPC decoding was performed at step S513, is the error-corrected data and may be provided externally or used in the memory controller 100.

In some embodiments, and when it is determined that the hard decision read data is not correct as the result of step S515, the soft decision decoding step S530 may be performed.

As described above, at step S531 of the soft decision read step, the soft decision read data may be read from the semiconductor memory device 200 according to the soft decision read voltages $V_{SD}$. For example, the additional read operation according to the soft decision read voltages $V_{SD}$ may be performed on the memory cell, on which the hard decision decoding step S510 was performed according to the hard decision read voltage $V_{HD}$. The soft decision read voltages $V_{SD}$ may be different than the hard decision read voltage $V_{HD}$.

At step S533, the soft decision LDPC decoding as the soft decision decoding may be performed. The soft decision LDPC decoding may be performed based on the soft decision read data comprising the hard decision read data, on which the hard decision LDPC decoding is performed, and data read from the memory cell according to the soft decision read voltages $V_{SD}$. The hard decision read voltage $V_{HD}$ and the soft decision read voltages $V_{SD}$ may be different.

For example, each of the memory cells MC0 to MCn-1 of the semiconductor memory device 200 may belong to one of the threshold voltage distributions including 7 program states P1 to P7 and 1 erase state E.

The hard decision read voltage $V_{HD}$ may have a voltage between 2 neighbouring states of the plurality of states (E and P1 to P7). Each of the soft decision read voltages $V_{SD}$ may have a voltage between 2 neighbouring states of the plurality of states (E and P1 to P7), which is different from the hard decision read voltage $V_{HD}$.

The hard decision read data read from the memory cells MC0 to MCn-1 according to the hard decision read voltage $V_{HD}$ and the soft decision read data read therefrom according to the soft decision read voltages $V_{SD}$ may have different values. For example, one of the memory cells MC0 to MCn-1 may be a "tail cell" (or "tail memory cell") that has a threshold voltage higher or lower than the threshold voltage distribution of the normal logic state. In an example, a "tail cell" is a memory cell that erases faster than average. The hard decision read data read from the tail memory cells according to the hard decision read voltage $V_{HD}$ and the soft decision read data read therefrom according to the soft decision read voltages $V_{SD}$ may have different values. When the additional read operation according to the soft decision read voltages $V_{SD}$ is performed as well as the read operation according to the hard decision read voltage $V_{HD}$, additional information on the threshold voltages of the memory cells MC0 to MCn-1 (e.g. additional information on the tail memory cells) or the log likelihood ratio (LLR) providing reliability of the hard decision read data read by the hard decision read operation may be obtained.

When the additional information is obtained, the probability of the likelihood ratio (which indicates whether the data of the memory cells MC0 to MCn-1 belong to the first state (i.e., '1'), or the second state (i.e., '0')) may increase. Thus, the reliability of the LDPC decoding may increase. The memory controller 100 may perform the soft decision LDPC decoding based on the soft decision read data, which is read according to the hard decision read voltage $V_{HD}$ and the soft decision read voltages $V_{SD}$. The relationship between the hard decision read voltage $V_{HD}$ and the soft decision read voltages $V_{SD}$ will be disclosed with reference to FIGS. 7A and 7B.

At step S535, it may be determined whether the soft decision LDPC decoding succeeds or fails; e.g., it may be determined whether an error of the soft decision read data, on which the soft decision LDPC decoding is performed at step S533, is corrected. For example, the memory controller 100 may determine whether an error of the soft decision read data is corrected by using the soft decision read data and the parity check matrix. For example, when the multiplication of the soft decision LDPC-decoded soft decision data and the parity check matrix is a zero vector ('0'), the soft-decision LDPC-decoded soft decision data may be determined to be correct data. Conversely, when the multiplication of the soft-decision LDPC-decoded soft-decision data and the parity check matrix is not a zero vector ('0') (e.g., contains at least one '1' bit), the soft-decision LDPC-decoded soft-decision data may be determined to be incorrect data.

In some embodiments, the process of computing the product of the parity check matrix and the hard decision read data during the hard decision decoding step S510 may be the same as the process of computing the product of the parity check matrix and the soft decision read data during the soft decision decoding step S530.

When it is determined that the soft decision read data is corrected as the result of determination of step S535, it may be determined at step S520 that the read operation according to soft decision read voltage $V_{SD}$ at step S531 is successful and the operation of the memory controller 100 may end. The soft decision read data, on which the soft decision LDPC decoding is performed at step S533, is error-corrected data and may be provided externally or used in the memory controller 100.

When it is determined that the soft decision read data is not corrected as the result of determination of step S535, it may be determined at step S540 that the read operation of the memory controller 100 to the memory cells MC0 to MCn-1 finally fails and the operation of the memory controller 100 may end.

Figure 6A:
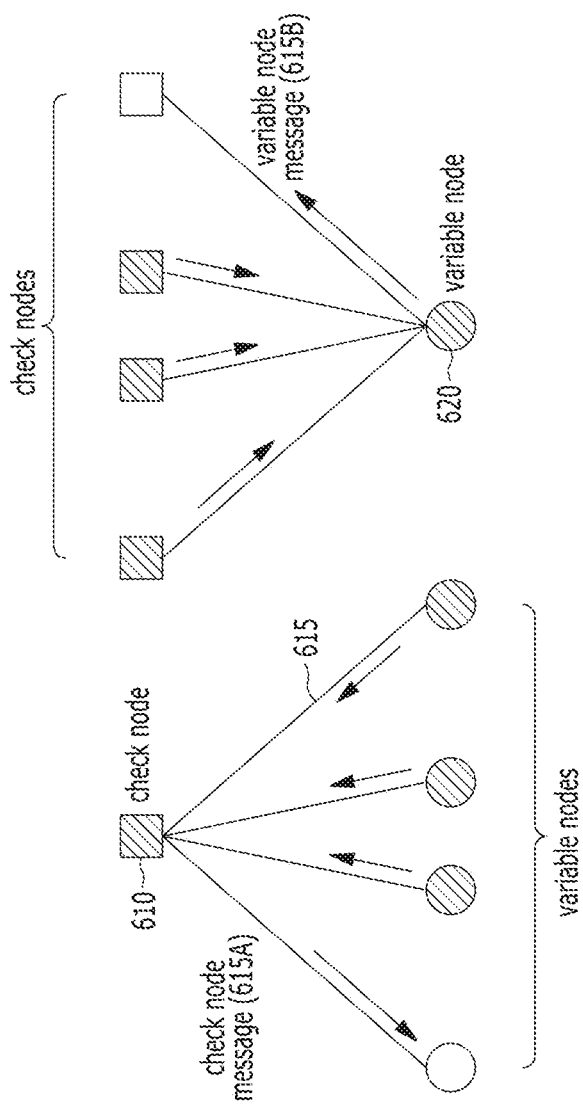
FIG. 6A is a schematic diagram illustrating an example of LDPC decoding represented by a Tanner graph.

FIG. 6A is a schematic diagram illustrating an example of LDPC decoding represented by a Tanner graph.

Figures 6B, 6C:
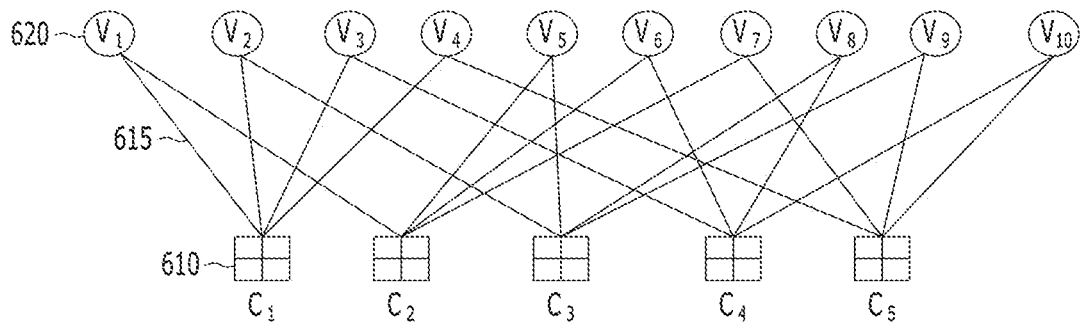
FIG. 6B is a schematic diagram illustrating an exemplary LDPC code.
FIG. 6C is a schematic diagram illustrating an exemplary syndrome check process according to LDPC decoding.

FIG. 6B is a schematic diagram illustrating an exemplary LDPC code.

FIG. 6C is a schematic diagram illustrating an example of a syndrome check process according to the WPC decoding.

An error correction code (ECC) is commonly in storage systems. Various physical phenomena occurring in storage devices result in noise effects that corrupt the stored information. Error correction coding schemes can be used for protecting the stored information against the resulting errors. This is done by encoding the information before storing the information in the memory device. The encoding process transforms the information bit sequence into a codeword by adding redundancy to the information. This redundancy can then be used in order to recover the information from the possibly corrupted codeword through a decoding process.

In iterative coding schemes, the code (or ECC) is constructed as a concatenation of several simple constituent codes and is decoded based on an iterative decoding algorithm by exchanging information between decoders receiving the simple constituent codes. Usually, the code can be defined using a bipartite graph or a Tanner graph describing interconnections between the constituent codes. In this case, decoding can be viewed as an iterative message passing over the graph edges.

The iterative codes may include a low-density parity-check (LDPC) code. The LDPC code is a linear binary block code defined by a sparse parity-check matrix H.

An LDPC code (either binary or non-binary) typically has a parity check matrix in which the number of non-zero elements in each row and column is very small, and its structure can be defined by the Tanner graph illustrated in FIG. 6A. As illustrated therein, the Tanner graph includes check nodes 610, variable nodes 620, and edges 615 connecting the check nodes 610 to the variable nodes 620. A value delivered from the check node 610 to the variable node 620 after check node processing becomes a check node message 615A, and a value delivered from the variable node 620 to the check node 610 after variable node processing becomes a variable node message 615B.

In an example, a decoding process of the LDPC code is performed by iterative decoding based on a 'sum-product' algorithm. In another example, a decoding method can be provided based on a suboptimal message-passing algorithm such as a 'min-sum' algorithm, which is a simplified version of the sum-product algorithm.

For example, referring to FIG. 6B, the Tanner graph of the LDPC code includes 5 check nodes 610 representing parity check equations of the LDPC code, 10 variable nodes 620 representing code symbols, and edges 615 representing relationships between the check nodes 610 and the variable nodes 620. The edges 615 connect each check node 610 to the variable node 620 corresponding to a code symbol included in the parity check equations represented by the check nodes 610. FIG. 6B illustrates an example of a regular LDPC code in which the number of variable nodes 620 coupled to each of the check nodes 610 is fixed at 4 and the number of the check nodes coupled to each of the variable nodes 620 is fixed at 2. An initial value of the variable node 620 may be one of the hard decision read data and the soft decision read data.

FIG. 6C shows a parity check matrix H corresponding to the Tanner graph. The parity check matrix H is similar to the graphical expression of the parity check equations. The parity check matrix H has the same number of is in each column and each row. For instance, each column of the parity check matrix H has two is corresponding to the connections between each of the variable nodes 620 and the check nodes 610, and each row has four is corresponding to the connections between each of the check nodes 610 and the variable nodes 620.

A process of decoding the LDPC code is performed by iteratively exchanging messages, which are generated and updated in each node, between the variable nodes 620 and the check nodes 610 in the Tanner graph. In this case, each node updates the messages based on the sum-product algorithm or another similar algorithm.

For example, the LDPC decoding on the hard decision read data may comprise a plurality of iterations, each of which includes an update of the check nodes, an update of the variable nodes, and a syndrome check after an initial update of the variable nodes. After the single iteration, and if the result of the syndrome check satisfies a predetermined condition, the LDPC decoding may end. When the result of the syndrome check does not satisfy the predetermined condition, an additional single iteration may be performed. The additional iteration may include a check node update, a variable node update and the syndrome check. The number of iterations may be limited to a maximum iteration count. When the result of the syndrome check does not satisfy the predetermined condition after the number of iterations has reached the maximum iteration count, the LDPC decoding on the codeword may be determined to have failed in LDPC decoding.

Referring to FIG. 6C, the syndrome check identifies whether the product result "Hv'" of the parity check matrix H and a vector "v", which is obtained by the update of the variable nodes, satisfies the predetermined condition. When the product result "Hv'" is the zero vector, the product result "Hv'" satisfies the predetermined condition.

FIG. 6C shows an example of the syndrome check process. FIG. 6C shows a non-zero vector "01000" as the product result "Hv'", and thus FIG. 6C shows that the syndrome check does not satisfy the predetermined condition and another single iteration should be performed.

Considering the non-zero vector "01000" as the product result "Hv'", the number of non-zero vector elements or elements, which do not meet the zero vector condition, is 1. In the description, the elements that do not meet the zero vector condition of the syndrome check for the product result "Hv'" in the single iteration is defined as an unsatisfied syndrome check (USC). Thus, FIG. 6C shows the result of the syndrome check wherein the number of the USC is 1.

Figure 7A:
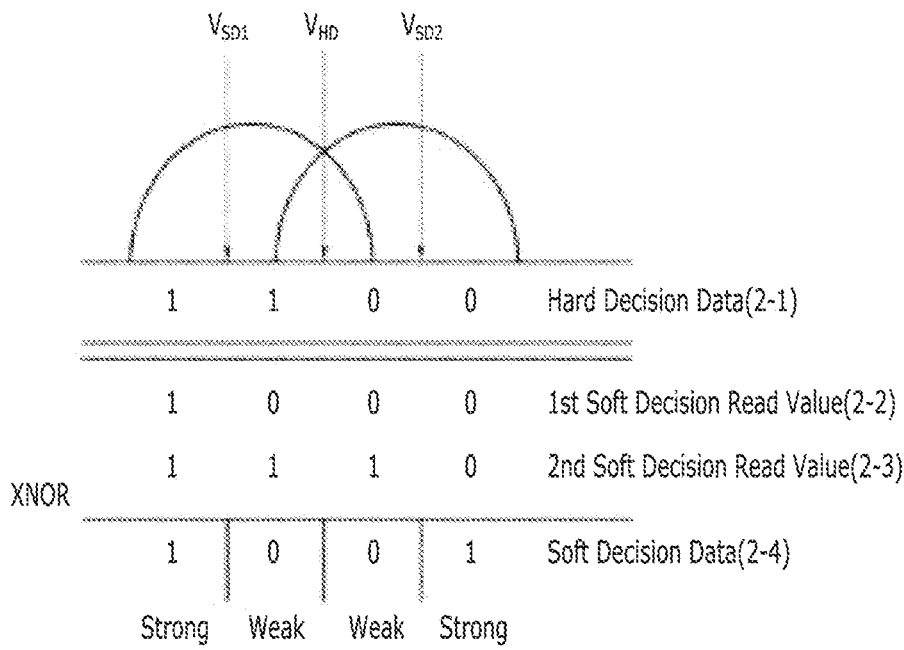
FIG. 7A is a schematic diagram illustrating an example soft decision read operation, as illustrated in FIG. 5.
Figure 7B:
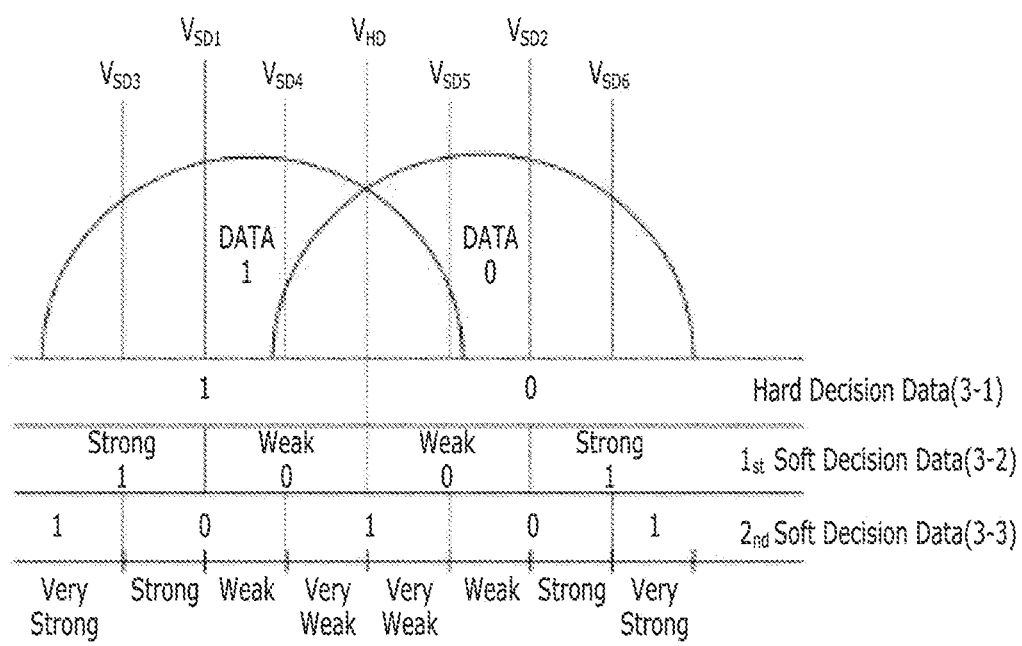
FIG. 7B is a schematic diagram illustrating another example soft decision read operation, as illustrated in FIG. 5.

FIGS. 7A and 7B are schematic diagrams illustrating different examples of the soft decision read operation shown in FIG. 5; in particular, 2-bit and 3-bit soft decision read operations, respectively.

Referring to the example illustrated in FIG. 7A, during the hard decision decoding operation of step S510 described with reference to FIG. 5, the hard decision read data 2-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ and $V_{SD2}$, which have different voltages from the hard decision read voltage $V_{HD}$, are applied to the memory cell.

Referring to FIG. 7A, in the case of a 2-bit soft decision read operation, when a first soft decision read voltage $V_{SD}1$ among the multiple soft decision read voltages $V_{SD1}$ and $V_{SD2}$ is applied to a memory cell, a first soft decision read data value 2-2 may have one value between 1 and 0 depending on whether the memory cell is on or off. Similarly, a second soft decision read data value 2-3 may have one value between 1 and 0 based on the second soft decision read voltage $V_{SD2}$ among the multiple soft decision read voltages $V_{SD1}$ and $V_{SD2}$.

For example, the LDPC unit 130 may generate a soft decision read data 2-4 or the through the XNOR operation to the first and second soft decision read values 2-2 and 2-3. The LLR 2-4 may show reliability of the hard decision read data 2-1.

For example, the value '1' of the soft decision read data 2-4 may show a "strong" probability of the first and second statuses (the logic values of '1' and '0') of the hard decision read data 2-1. On the other hand, the value '0' of the soft decision read data 2-4 may show a "weak" probability of the first and second statuses of the hard decision read data 2-1.

Referring to the example illustrated in FIG. 7B, during the hard decision decoding operation of step S510 described with reference to FIG. 5, the hard decision read data 3-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ to $V_{SD2}$, which have different voltages from the hard decision read voltage $V_{HD}$, are applied to the memory cell.

Referring to FIG. 7B, in the case of a 3-bit soft decision read operation, when the first and second soft decision read voltages $V_{SD1}$ and $V_{SD2}$ among the multiple soft decision read voltages $V_{SD1}$ to $V_{SD6}$ are applied to a memory cell, the first and second soft decision read data values may be generated as described above with reference to FIG. 7A, and then an exclusive NOR (XNOR) operation may be performed on the first and second soft decision read data values so as to generate the first soft decision data 3-2.

In a similar manner, during the 3-bit soft decision read operation, the third to sixth soft decision read values may be generated according to the on/off status of the memory cell when the third to sixth soft decision read voltages $V_{SD3}$ to $V_{SD6}$, which have different voltages from the first and second soft decision read voltages $V_{SD1}$ and $V_{SD2}$ are applied to the memory cell, which is similar to the 2-bit soft decision read operation described with reference to FIG. 7A. The LDPC unit 130 may generate a second soft decision read data 3-3 ('10101') or data used for generating the LLR through the XNOR operation to the third to sixth soft decision read values. The LLR 3-3 ('10101') may provide a weighted value to the first soft decision read data 3-2.

For example, the value '1' of the second soft decision read data 3-3 may show a "very strong" probability of the first status (the logic value of '1') of the first soft decision read data 3-2. On the other hand, the value '0' of the second soft decision read data 3-3 may show a "strong" probability of the first status of the first soft decision read data 3-2.

In a similar manner, the value '1' of the second soft decision read data 3-3 may show a "very weak" probability of the second status (the logic value of '0') of the first soft decision read data 3-2. On the other hand, the value '0' of the second soft decision read data 3-3 may show a "weak" probability of the second status of the first soft decision read data 3-2. The LLR 3-3 may provide a better reliability to the hard decision read data 3-1, which is similar to the 2-bit soft decision read operation described with reference to FIG. 7A.

Figure 8:
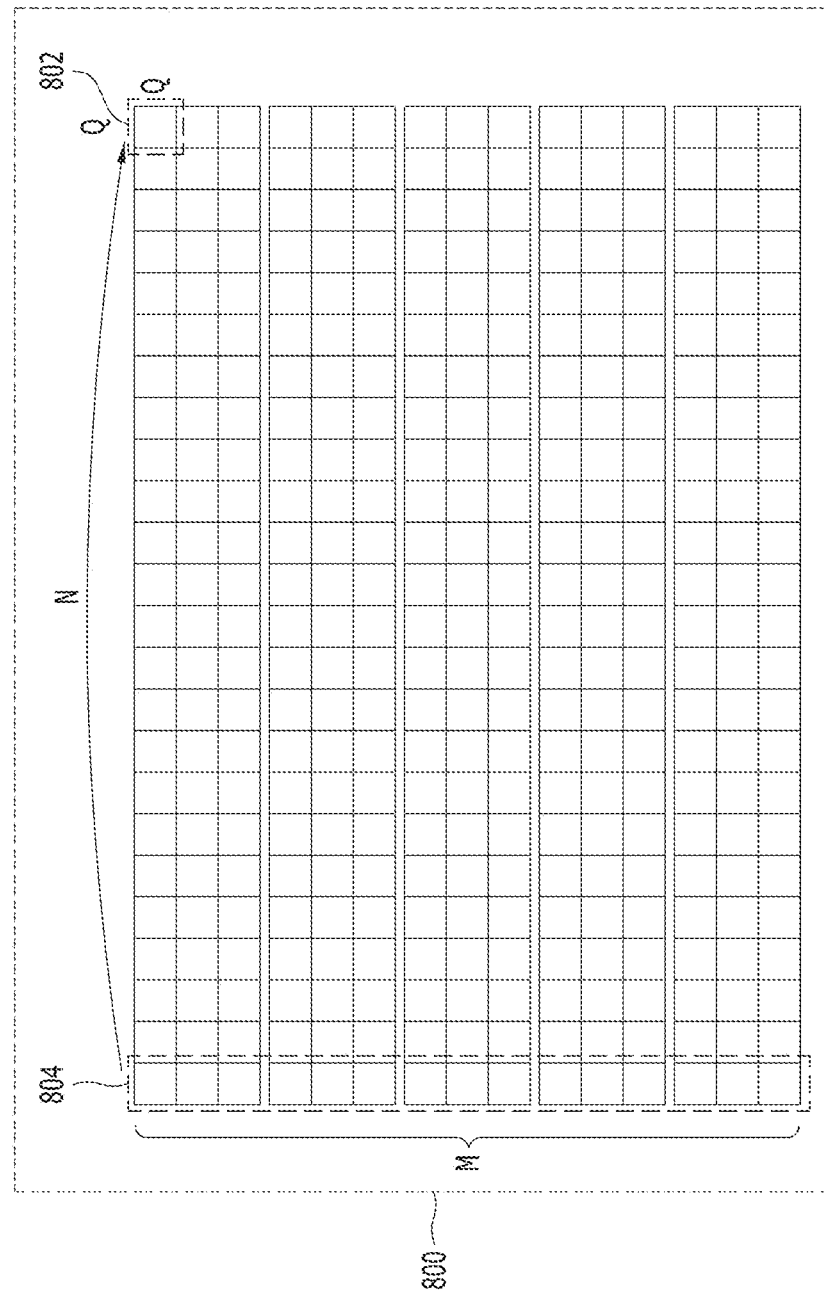
FIG. 8 illustrates an example parity check matrix 800 in accordance with an embodiment of the presently disclosed technology.

FIG. 8 is a diagram illustrating an example of a parity check matrix 800 according to an embodiment of the presently disclosed technology.

The parity check matrix 800 may include M N sub-matrices 802, and each of the sub-matrices 802 may be a zero matrix or a cyclically shifted identity matrix of size Q*Q. Each entry of the parity check matrix 800 defining a binary LDPC code is either 0 or 1.

As described above with reference to FIG. 6A, the structure of the LDPC code may be defined by a Tanner graph formed of check nodes, variable nodes, and edges connecting the check nodes and the variable nodes.

The check nodes and the variable nodes forming the Tanner graph may correspond to the rows and columns of the parity check matrix 800, respectively. Therefore, the number of the rows of the parity check matrix 800 and the number of the columns of the parity check matrix 800 may correspond to the number of the check nodes and the number of the variable nodes that form the Tanner graph, respectively. When the entry of the parity check matrix 800 is 1, the check node and the variable node which correspond to the row and the column where the entry is positioned may be connected by an edge on the Tanner graph.

The bit flipping algorithm may be a decoding algorithm that includes reading from the semiconductor memory device 200 while inverting the decision value C of the variable nodes (e.g., changing a '1' to a '0', or vice versa) based on a threshold value T and an inversion function $E_i$ that is generated based on a hard decision value R provided from a channel, a decision value C of the variable nodes and a backup syndrome $S_p$.

The LDPC unit 130 may perform an LDPC decoding operation according to the bit flipping algorithm in a vertically shuffled scheduling (VSS) scheme. According to the vertically shuffled scheduling scheme, the LDPC unit 130 may select sub-matrices 804 that share the same layer (or layer index) among a plurality of sub-matrices 802 forming the parity check matrix 800 and perform a variable node selecting operation of selecting variable nodes that correspond to the columns forming the selected sub-matrices. The LDPC unit 130 may provide variable node messages from the selected variable nodes to the check nodes connected to the selected variable nodes. The LDPC unit 130 may perform a check node updating operation based on the provided variable node messages for the check nodes provided with the variable node messages. The check nodes performing the check node updating operation may provide the check node message to the variable nodes connected to the check nodes. The LDPC unit 130 may perform a variable node updating operation on the variable nodes provided with the check node messages based on the provided check node messages. The LDPC unit 130 may perform the LDPC decoding operation in the vertically shuffled scheduling method by repeatedly performing the variable node selecting operation, the check node updating operation, and the variable node updating operation, until the LDPC decoding operation is performed successfully.

Figure 9:
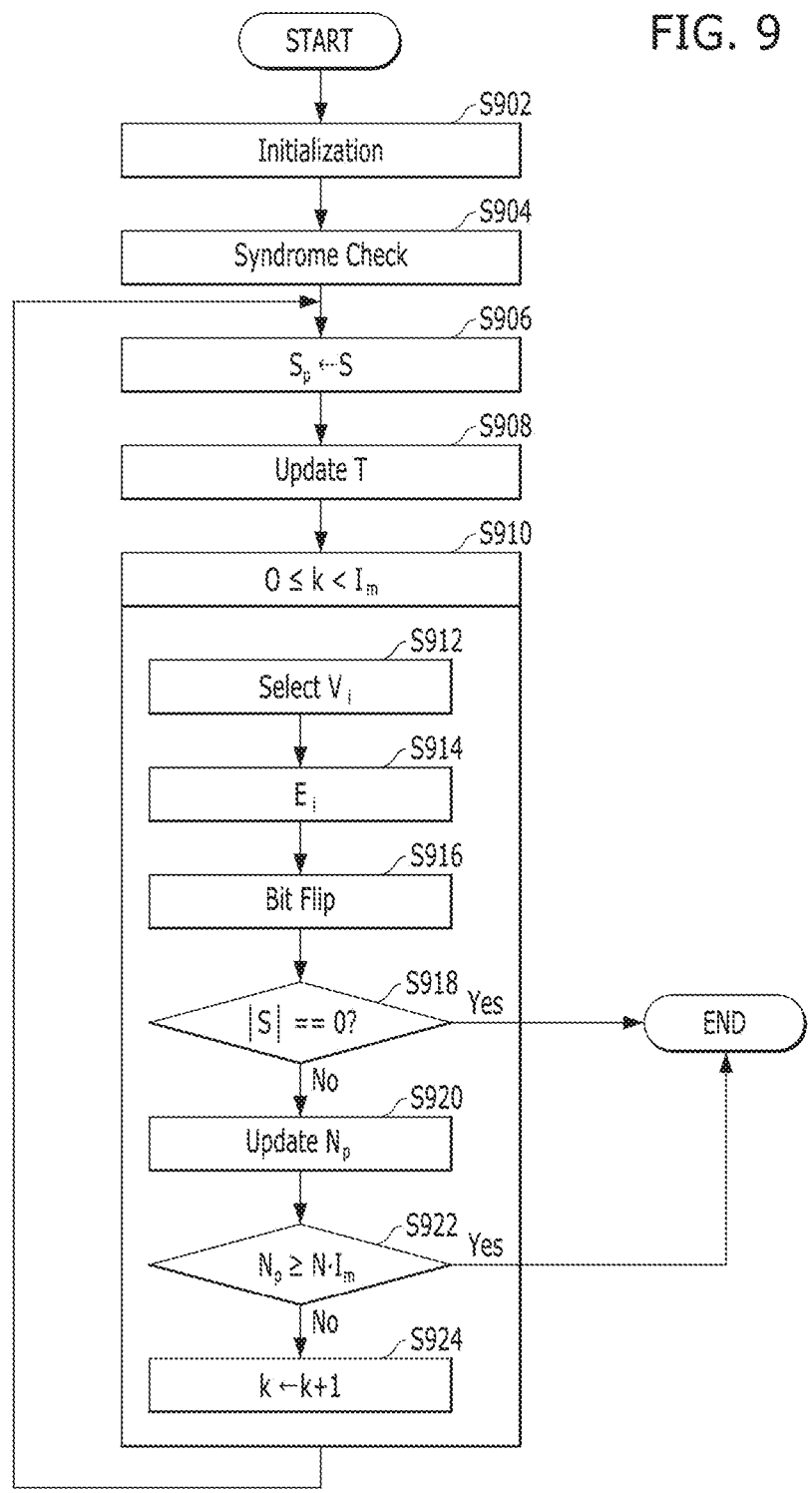
FIG. 9 is a flowchart describing an example bit flipping algorithm according to a vertically shuffled scheduling scheme.

FIG. 9 is a flowchart describing an exemplary bit flipping algorithm according to the vertically shuffled scheduling scheme.

In step S902, the LDPC unit 130 may perform an initialization operation. The LDPC unit 130 may initialize the decision value C of the variable nodes to the hard decision value R provided from the channel. Also, the LDPC unit 130 may initialize the number N of the processed sub-matrices to 0.

In step S904, the LDPC unit 130 may calculate the syndrome S based on the decision value C of the initialized variable nodes. The LDPC unit 130 may calculate the syndrome S by multiplying the parity check matrix H by the decision value C of the initialized variable nodes. When all the entries included in the calculated syndrome S have a value of 0, the LDPC unit 130 may terminate the LDPC decoding operation and output the decision value C of the initialized variable nodes.

In step S906, when at least one entry among the entries included in the calculated syndrome S has a value of 1, the LDPC unit 130 may separately store the calculated syndrome S as a backup syndrome $S_p$. The backup syndrome, in an example, is the previously calculated syndrome prior to a subsequent updating step or operation.

In step S908, the LDPC unit 130 may calculate the threshold value T based on the backup syndrome $S_p$ stored in the step S906. Also, the LDPC unit 130 may detect check nodes corresponding to the entries having a value of 1 in the backup syndrome $S_p$ as unsatisfied check nodes (UCNs).

The unsatisfied check nodes may be the check nodes whose number of variable nodes having a decision value of 1 is an odd number among the variable nodes respectively connected to the check nodes among the check nodes on the Tanner graph, which is described above with reference to FIG. 6A. The LDPC unit 130 may obtain the number of check nodes corresponding to the detected unsatisfied check nodes UCN among the check nodes respectively connected to the variable nodes for each variable node. As described later, the LDPC unit 130 may obtain an inversion function value $E_i$ for each of the variable nodes based on unsatisfied check nodes UCN that are respectively connected to the variable nodes. The LDPC unit 130 may compare the inversion function value $E_i$ of the selected variable nodes with the calculated threshold value T and invert the decision value C of the variable nodes whose inversion function value $E_i$ is greater than the threshold value T.

In step S910, the LDPC unit 130 may perform a sub-iteration unit which includes a variable node selection step (or operation) S912, an inversion function generation step (or operation) S914, a bit flipping operation/step S916, a syndrome checking step S920, a number of processed sub-matrices $N_p$ updating step S920, and a maximum iteration count checking step S922, until (a) the LDPC decoding operation is performed successfully, or (b) upon determining that the LDPC decoding operation is not performed successfully but the sub-iteration unit has reached the maximum iteration count $I_M$.

In step S912, the LDPC unit 130 may select variable nodes up to a size of a basic processing unit P (also referred to as the basic processing unit P in this document) from the parity check matrix 800. The size of the basic processing unit P may be the number P of variable nodes that may perform a LPDC decoding operation in parallel. As described above, since the columns of the parity check matrix 800 correspond to the variable nodes, respectively, the LDPC unit 130 may be able to select the variable nodes up to the size of the basic processing unit P by selecting a number of columns up to the size the basic processing unit P among the columns of the parity check matrix 800. The size of the basic processing unit P may be different according to the number of variable node units included in the LDPC unit 130. The size of the basic processing unit P may be an integer z·Q which is obtained by multiplying the number Q of the columns forming the sub-matrices 802 by a rational number z.

The LDPC unit 130 may obtain a current sub-matrix index $i_c$ and, when a subsequent sub-iteration unit activates, select variable nodes from the remaining variable nodes excluding the variable nodes that are selected by the current sub-iteration unit. The LDPC unit 130 may obtain the current sub-matrix index $i_c$ according to a modulo operation as shown in Equation 1.

$$i_c = N_p \bmod N \qquad \text{Equation 1}$$

The LDPC unit 130 may perform a modulo operation on the number $N_p$ of the processed sub-matrices and the number N of sub-matrices included in a unit row of the parity check matrix H so as to obtain the current sub-matrix index $i_c$. The LDPC unit 130 may obtain a remainder by dividing the number $N_p$ of the processed sub-matrices by the number N of the sub-matrices that are included in a unit row of the parity check matrix H to perform the modulo operation.

The LDPC unit 130 may calculate indices a up to a size of the basic processing unit P according to Equation 2 (e.g., resulting in P indices as shown therein), and based on the calculated current sub-matrix index $i_c$, the number Q of the columns that form the sub-matrix 802, and the basic processing unit P. The indices may respectively correspond to the columns of the parity check matrix 800.

$$i=\{i_c*Q, i_c*Q+1 \ldots, i_c*Q+P-1\}$$ Equation 2

The LDPC unit 130 may obtain a first value by multiplying the number Q of the columns forming the sub-matrix 802 by the current sub-matrix index $i_c$ and denoting that as a first index, and obtain a value by adding 1 to the first index and denoting that as a second index. The LDPC unit 130 may sequentially obtain the subsequent indices by sequentially adding 1 to the first index based on a size of the basic processing unit P. The LDPC unit 130 may obtain a value by adding the size of the basic processing unit P to the first index, and then subtracting 1 from the addition result, and denoting that as the last index. The LDPC unit 130 may select as many variable nodes $V_i$ as a size of the basic processing unit P by selecting the columns of the parity check matrix 800 that correspond to the indices i.

For example, when the basic processing unit P is initialized to a value of 0, the LDPC unit 130 may perform the modulo operation to obtain the value of the current sub-matrix index $i_c$, as '0'. The LDPC unit 130 may perform a modulo operation to obtain 0 to P−1 as the indices i, and the LDPC unit 130 may select variable nodes $V_i$ up to a size of the basic processing unit P corresponding to the columns of the selected parity check matrix 800 by selecting the columns of the parity check matrix 800 corresponding to the indices i.

In step S914, the LDPC unit 130 may calculate the inversion function value $E_i$ of the selected variable nodes $V_i$ based on the backup syndrome $S_p$, the decision value $C_i$ of the selected variable nodes $V_i$, and the hard decision value $R_i$ of the selected variable nodes $V_i$.

In step S916, the LDPC unit 130 may perform a bit flipping operation of inverting the decision value $C_i$ of the selected variable nodes $V_i$ based on the threshold value T calculated in the step S908 and the inversion function value $E_i$ calculated in the step S914. The LDPC unit 130 may update the decision value C of all the variable nodes corresponding to all the columns that form the parity check matrix 800 based on the inverted decision value $C_i$ of the selected variable nodes $V_i$.

In step S918, the LDPC unit 130 may calculate the syndrome S by multiplying the parity check matrix H by the decision value C of the variable nodes updated in the step S916. When all the entries forming the calculated syndrome S have a value of 0 ('Y' in the step S918), the LDPC unit 130 may terminate the LDPC decoding operation and output the updated decision value C of the variable nodes.

In step S920, when one or more entries among the entries included in the calculated syndrome S has a value of 1 ('N' in the step S918), the LDPC unit 130 may update the number $N_p$ of the processed sub-matrices based on Equation 3.

$$N_p \leftarrow N_p + z$$ Equation 3

The LDPC unit 130 may update the number $N_p$ of the processed sub-matrices into a value obtained by adding the rational number z, which is a size of the basic processing unit P divided by the number of variable nodes included in each of the sub-matrices Q, to the number $N_p$ of the processed sub-matrices.

In step S922, the LDPC unit 130 may check whether the number of times that a decoding operation is performed until the current moment, i.e., the decoding iteration count, has reached the maximum iteration count $I_M$ or not. In an example, when the number $N_p$ of the processed sub-matrices reaches a value which is obtained by multiplying the maximum iteration count $I_M$ by the number N of sub-matrices included in a unit row of the parity check matrix H ('Y' in the step S922), the LDPC unit 130 may determine the LDPC decoding operation has failed and output a decoding failure signal. In another example, when the number $N_p$ of the processed sub-matrices reaches a value which is obtained by multiplying the maximum iteration count $I_M$ by the number N of sub-matrices included in a unit row of the parity check matrix H ('N' in the step S922), the LDPC unit 130 may increase the sub-iteration index k by '1' in step S924.

In step S924, when the sub-iteration index k reaches the maximum sub-iteration count $I_m$, the LDPC unit 130 may go back to the step S906 to update the backup syndrome $S_p$ and the threshold value T. If the sub-iteration index k has not reached the maximum sub-iteration count $I_m$, the LDPC unit 130 may iteratively perform the operation of the step S910.

In the case of a flash memory, a large amount of data may have to be processed within a predetermined time in order to satisfy a read operation performance required by a specification determined by a manufacturer. Therefore, the flash memory may require an LDPC decoder 133 having a high throughput. In order to have a high throughput, the LDPC decoder 133 may require an LDPC decoding algorithm having an improved error correction performance under an extremely limited maximum iteration count $I_M$.

In the case of a conventional bit flipping algorithm e LDPC unit 130 may obtain a value by dividing the number Q*N of all the rows forming the parity check matrix H by a size of the basic processing unit P, determine the value as the maximum sub-iteration count $I_m$, and perform an LDPC decoding operation. Therefore, the LDPC unit 130 may repeatedly perform a sub-iteration operation (the step S910) for all the variable nodes corresponding to all the rows forming the parity check matrix H up to the maximum sub-iteration count $I_m$ and then update the backup syndrome $S_p$ and the threshold value T.

Since existing bit flipping algorithms update the backup syndrome $S_p$ and the threshold value T only a few times during an LDPC decoding operation, there exists a problem in that the convergence performance under an extremely constrained maximum iteration count $I_M$ is significantly lower than the convergence performance under the condition where the maximum iteration count $I_M$ is not constrained.

The LDPC decoding algorithm in accordance with an embodiment of the presently disclosed technology may increase the number of times that the backup syndrome $S_p$ and the threshold value T are updated while performing one iteration unit for performing an LDPC decoding operation on all the variable nodes corresponding to all the rows that form the parity check matrix H by reducing the maximum sub-iteration count $I_m$ compared to that of existing implementations. According to some embodiments of the presently disclosed technology, the LDPC unit 130 may be able to update the backup syndrome $S_p$ and the threshold value T more frequently while performing the one iteration unit. Therefore, the error correction performance of the LDPC unit 130 may be improved under the condition of a constrained (or limited) maximum iteration count $I_M$ based on the latest update information. In other embodiments, the LDPC decoding algorithm may have even better error correction performance based on dynamically changing the maximum sub-iteration count $I_m$ each time operations for a new one iteration unit are about to start.

Figure 10:
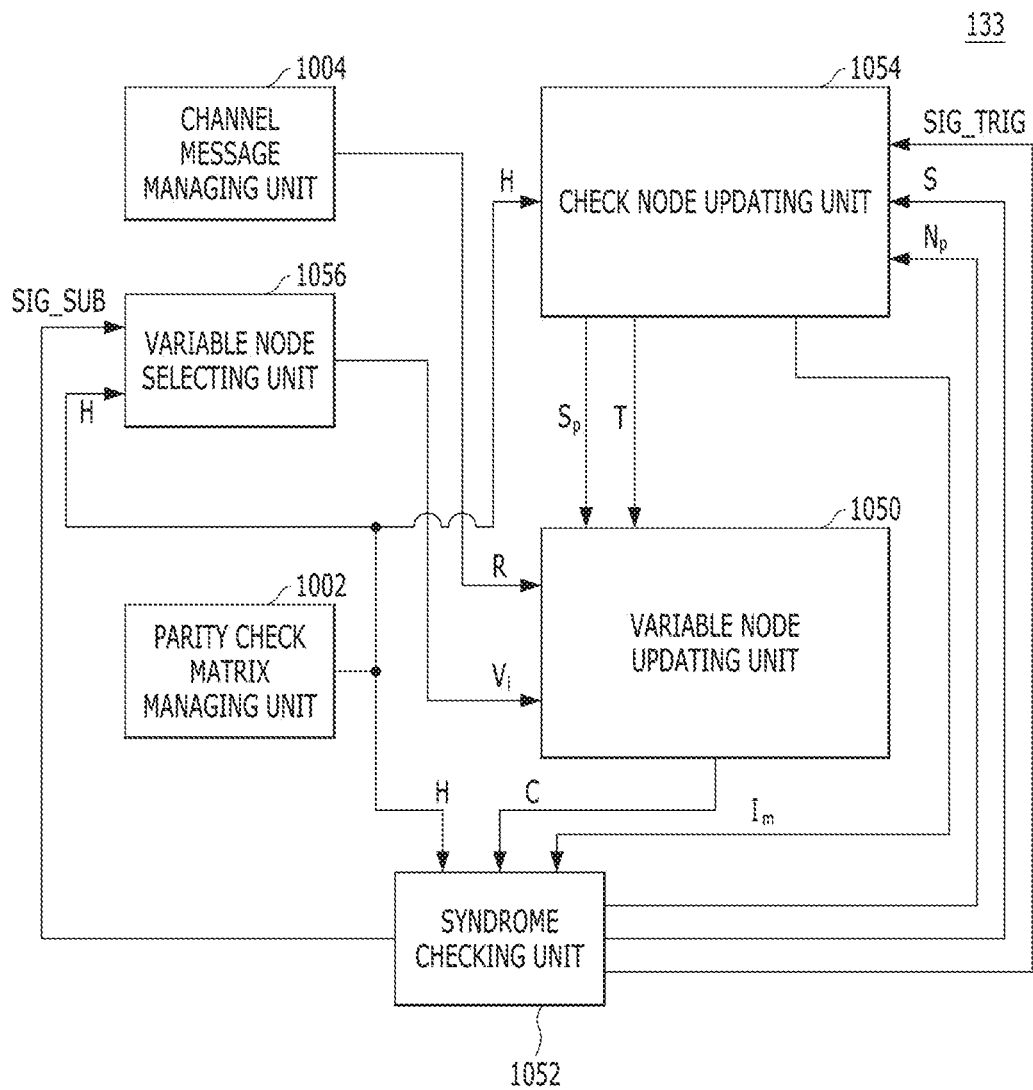
FIG. 10 is a detailed block diagram illustrating an exemplary Low-Density Parity Check (LDPC) decoder 133 shown in FIGS. 3 and 4A.

FIG. 10 is a detailed block diagram illustrating an exemplary LDPC decoder 133 shown in FIGS. 3 and 4A.

As described above with reference to FIG. 3, the LDPC encoder 131 may store a codeword, which is formed by performing an error correction encoding operation onto a data to be programmed into the semiconductor memory device 200, in the semiconductor memory device 200. The LDPC decoder 133 may perform an error correction decoding operation onto the data that is read from the semiconductor memory device 200 to recover the original data.

The LDPC decoder 133 may include a parity check matrix managing unit (or parity check matrix manager) 1002, a channel message managing unit (or channel message manager) 1004, a variable node selecting unit (or variable node selector) 1056, a variable node updating unit (or a variable node updater) 1050, a syndrome checking unit (or a syndrome checker) 1052, and a check node updating unit (or a check node updater) 1054.

The parity check matrix managing unit 1002 may store information on the parity check matrix H. As described above with reference to FIG. 8, according to some embodiments of the presently disclosed technology, the parity check matrix H may include M*N sub-matrices 802, and each of the sub-matrices 802 may be a zero matrix or a Q*Q cyclically shifted identity matrix. Each row and column of the parity check matrix H may correspond to a check node and a variable node on a Tanner graph, and when a variable node and a check node are connected by an edge, an entry positioned in each row and column of the parity check matrix H may have a value of 1. The parity check matrix managing unit 1002 may provide the syndrome checking unit 1052 with information on the stored parity check matrix H.

The channel message managing unit 1004 may obtain a hard decision value R for the variable nodes based on the codeword which is read from the semiconductor memory device 200. As described above with reference to FIG. 5, the semiconductor memory device 200 is able to read the data stored in a memory cell (e.g., a codeword) at a hard decision voltage $V_{HD}$. The channel message managing unit 1004 may be able to obtain the hard decision value R based on the read codeword. The channel message managing unit 1004 may provide the variable node updating unit 1050 with information on the hard decision value R.

The variable node selecting unit 1056 may select as many variable nodes as the basic processing unit P. The variable node selecting unit 1056 may select the columns up to a size of as many as the basic processing unit P from the parity check matrix H, and select the variable nodes corresponding to the selected columns. The variable node selecting unit 1056 may obtain the current sub-matrix index $i_c$ based on Equation 1. The variable node selecting unit 1056 may perform a modulo operation on the number $N_p$ of the processed sub-matrices and the number N of the sub-matrices included in the unit row of the parity check matrix H to obtain the current sub-matrix index $i_c$. The variable node selecting unit 1056 may detect a column corresponding to a value which is obtained by multiplying the obtained current sub-matrix index $i_c$ by the number Q of the columns forming the sub-matrix 802 among the columns that form the parity check matrix H. The variable node selecting unit 1056 may have the detected column as the column of the smallest order and then sequentially select columns up to the size of the basic processing unit P in an ascending order. The variable node selecting unit 1056 may select variable nodes corresponding to the selected columns by selecting the columns that form the parity check matrix H.

For example, the variable node selecting unit 1056 may detect a column corresponding to a first value (or first index) which is obtained by multiplying the current sub-matrix index by the number Q of the columns forming the sub-matrix 802 among the columns that form the parity check matrix H, and determine a variable node corresponding to the detected column as a first selected variable node. The variable node selecting unit 1056 may detect columns corresponding to second and subsequent values (or second and subsequent indices) which are obtained by sequentially adding '1' to the first value, among the columns that form the par check matrix H, and obtain the variable nodes corresponding to the detected columns in an ascending order. The variable node selecting unit 1056 may obtain a last value by adding a size of the basic processing unit P to the first value, so as to produce an addition result, and then subtracting 1 from the addition result, detect a column corresponding to the last value from the columns that form the parity check matrix H, detect a variable node corresponding to the detected column as the last variable node. In this way, the variable node selecting unit 1056 may be able to select as many variable nodes as the size of the basic processing unit P. The variable node selecting unit 1056 may provide the variable node updating unit 1050 with information on the selected variable nodes $V_i$.

The variable node updating unit 1050 may initialize the decision value C of the variable nodes based on the provided hard decision value R. Also, the variable node updating unit 1050 may invert the decision value $C_i$ of the selected variable nodes based on the information on the selected variable nodes $V_i$. The variable node updating unit 1050 may update the decision value C of the variable nodes corresponding to all the columns that form the parity check matrix H based on the decision value $C_i$ of the inverted selected variable nodes $V_i$. The variable node updating unit 1050 may calculate an inversion function value $E_i$ for the selected variable nodes $V_i$, and invert the decision value C of the selected variable nodes $V_i$ by comparing the inversion function value $E_i$ calculated for each of the selected variable nodes $V_i$ with the threshold value T. An exemplary structure for calculating the inversion function value $E_i$ and inverting the decision value C of the selected variable nodes $V_i$ will be described later with reference to FIG. 11. The variable node updating unit 1050 may provide the syndrome checking unit 1052 with information on the decision value C of the updated variable nodes.

The syndrome checking unit 1052 may determine whether the decoding operation performed on the codeword is successful or not based on the information on the decision value C of the provided variable nodes. When all the entries forming the syndrome S which is obtained by multiplying the decision value C of the variable nodes by the parity check matrix H have a value of 0, the syndrome checking unit 1052 may decide that the codeword is successfully decoded and output the decision value C of the variable nodes. When at least one entry among the entries forming the syndrome S which is obtained by multiplying the decision value C of the variable nodes by the parity check matrix H has a value of 1, the syndrome checking unit 1052 may decide that the codeword is not successfully decoded.

The syndrome checking unit 1052 may update the number $N_p$ of the processed sub-matrices as described above with reference to Equation 3. The syndrome checking unit 1052 may check whether a sub-iteration count and an iteration count reach the maximum sub-iteration count $I_m$ and the maximum iteration count $I_M$ or not, respectively, based on the updated number $N_p$ of the processed sub-matrices. If the sub-iteration count has not reached the maximum sub-iteration count $I_m$, the syndrome checking unit 1052 may provide the variable node selecting unit 1056 with a sub-iteration signal SIG_SUB so that the variable nodes up to a size of a processing unit $P_c$ may be updated by repeating operations of the sub-iteration unit, which include a variable node selecting operation, a variable node updating operation, and a syndrome checking operation. These operations may be repeated up to the maximum sub-iteration count $I_m$. When the sub-iteration count reaches the maximum sub-iteration count $I_m$, the syndrome checking unit 1052 may provide the check node updating unit 1054 with a trigger signal SIG_TRIG, a syndrome S, and the number $N_p$ of the processed sub-matrices.

The syndrome checking unit 1052 may check whether the number $N_p$ of the processed sub-matrices reaches a value which is obtained by multiplying the number N of the sub-matrices included in a unit row of the parity check matrix H by the maximum iteration count $I_M$ or not. When the number $N_p$ of the processed sub-matrices reaches the value which is obtained by multiplying the number N of the sub-matrices included in the unit row of the parity check matrix H by the maximum iteration count $I_M$, the syndrome checking unit 1052 may terminate the LDPC decoding operation and determine that the codeword is uncorrectable.

The check node updating unit 1054 may update the backup syndrome $S_p$, the processing unit $P_c$, and the threshold value T based on the provided trigger signal SIG_TRIG. The check node updating unit 1054 may update the backup syndrome $S_p$ such that the entries forming the backup syndrome $S_p$ have the same values as the entries forming the provided syndrome S. The number of the entries having a value of 1 among the entries forming the backup syndrome $S_p$ may be equal to the number of the unsatisfied check nodes UCN that exist at the moment when the backup syndrome $S_p$ is updated.

The check node updating unit 1054 may update the processing unit $P_c$ (or the size of the processing unit $P_c$) based on the updated backup syndrome $S_p$. The processing unit $P_c$ may be a value obtained by multiplying the basic processing unit P by the maximum sub-iteration count $I_m$, and the check node updating unit 1054 may update the backup syndrome $S_p$, the threshold value T, and the maximum sub-iteration count $I_m$ whenever the variable nodes as many as the processing unit $P_c$ are updated. The check node updating unit 1054 may obtain the updated maximum sub-iteration count $I_m$ by dividing the updated processing unit $P_c$ by the basic processing unit P.

The check node updating unit 1054 may update the threshold value T based on the updated backup syndrome $S_p$, the processing unit $P_c$, and the number of the processed sub-matrices $N_p$ which is provided above. An example of the detailed structure for updating the processing unit $P_c$ and the threshold value T will be described later with reference to FIG. 13. The check node updating unit 1054 may provide the variable node updating unit 1050 with information on the updated threshold value T and the backup syndrome $S_p$ and provide the syndrome checking unit 1052 with information on the maximum sub-iteration count $I_m$.

Figure 11:
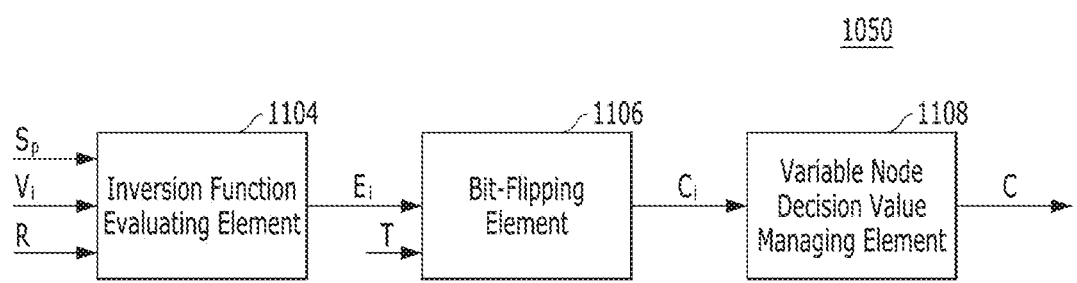
FIG. 11 is a block diagram illustrating an example structure of a variable node updating unit 1050.

FIG. 11 is a block diagram illustrating an example structure of the variable node updating unit 1050.

The variable node updating unit 1050 may include an inversion function evaluating element (or an inversion function evaluator) 1104, a bit-flipping element 1106, and a variable node decision value managing element (or a variable node decision value manager) 1108.

The inversion function evaluating element 1104 may calculate the inversion function value $E_i$ of the selected variable nodes $V_i$ based on the information on the provided backup syndrome $S_p$, the selected variable nodes $V_i$, and the hard decision value $R_i$. According to some embodiments of the presently disclosed technology, the inversion function evaluating element 1104 may calculate the inversion function value $E_i$ of the selected variable nodes $V_i$ as shown in Equation 4.

$$E_i = S_p{}' \cdot H_i + (C_i \oplus R_i) \qquad \text{Equation 4}$$

The inversion function evaluating element 1104 may calculate the inversion function value $E_i$ of the selected variable nodes $V_i$ by obtaining a first value by performing an inner product operation on the previous backup syndrome $S_p{}'$ and the entries included in the columns of the parity check matrix H corresponding to the selected variable nodes $V_i$, obtaining a second value by performing an XOR operation on the decision value $C_i$ of the selected variable nodes and the hard decision value $R_i$ of the selected variable nodes, and then summing the first value and the second value. The previous backup syndrome $S_p{}'$ may represent the backup syndrome $S_p$ that is stored in the previous iteration unit, and the first value obtained by performing an inner product operation on the previous backup syndrome $S_p{}'$ and the entries included in the columns of the parity check matrix H corresponding to the selected variable nodes $V_i$ may represent the number of the unsatisfied check nodes UCN connected to the selected variable nodes $V_i$. The inversion function evaluating element 1104 may provide the bit-flipping element 1106 with information on the calculated inversion function value $E_i$.

The bit-flipping element 1106 may perform a bit flipping operation on the selected variable nodes $V_i$ based on the provided threshold value T and the inversion function value $E_i$ of the selected variable nodes $V_i$. According to some embodiments of the presently disclosed technology, the bit-flipping element 1106 may perform the bit flipping operation by inverting the decision value $C_i$ of the variable nodes $V_i$ having an inversion function value $E_i$ which is greater than the threshold value T.

$$C_i = \begin{cases} C_i \oplus 1, & E_i \geq T (\text{case 1}) \\ C_i, & E_i < T (\text{case 2}) \end{cases} \qquad \text{Equation 5}$$

The bit-flipping element 1106 may perform a bit flipping operation on the selected variable nodes $V_i$ by performing an XOR operation on 1 and the decision value $C_i$ of the variable nodes whose inversion function value $E_i$ is equal to or greater than the threshold value T. The bit-flipping element 1106 may maintain the existing decision value for the decision value $C_i$ of the variable nodes whose inversion function value $E_i$ is smaller than the threshold value T.

According to another embodiment of the presently disclosed technology, the bit-flipping element 1106 may perform a bit flipping operation in consideration of not only the inversion function value $E_i$ but also a state variable $W_i$. The bit-flipping element 1106 may set the state variable $W_i$ of the variable nodes whose inversion function value $E_i$ is equal to or greater than a predetermined threshold value to 1 among the variable nodes on which the bit flipping operation is not performed for a predetermined iteration count. The bit-flipping element 1106 may invert the decision value $C_i$ of the variable nodes whose state variable $W_i$ is 1 among the variable nodes whose inversion function value $E_i$ is smaller than the threshold value T, as shown in Equation 6.

$$C_i, W_i = \begin{cases} C_i \oplus 1, W_i \ldots E_i \geq T \text{(case 1)} \\ C_i \oplus 1, W_i \ldots T-1 \leq E_i < T, W_i = 1 \text{(case 2)} \\ C_i, W_i \oplus 1 \ldots T-1 \leq E_i < T, W_i = 0 \text{(case 3)} \\ C_i, W_i \text{(Otherwise)} \end{cases} \quad \text{Equation 6}$$

The bit-flipping element 1106 may perform a bit flipping operation on the variable nodes by performing an XOR operation on 1 and the decision value $C_i$ of the variable nodes whose inversion function value $E_i$ is greater than the threshold value T. The bit-flipping element 1106 may perform a bit flipping operation on the variable nodes having an inversion function value $E_i$ which is smaller than the threshold value T and smaller than the threshold value T by 1, and having a state variable $W_i$ which is 1. The bit-flipping element 1106 may maintain the existing decision value for the variable nodes having an inversion function value $E_i$ which is smaller than the threshold value T and smaller than the threshold value T by 1, and having a state variable $W_i$ which is 0, and may update the state variable $W_i$ to 1 by performing an XOR operation on 1 and the state variable $W_i$. The bit-flipping element 1106 may maintain the existing decision value for the variable nodes having an inversion function value $E_i$ which is smaller than the threshold value T and greater than the threshold value T by 1. The bit-flipping element 1106 may provide the variable node decision value managing element 1108 with information on the inverted decision value $C_i$ of the selected variable nodes $V_i$.

According to the embodiment of the presently disclosed technology, the bit-flipping element 1106 may have improved error correction capabilities by detecting variable nodes having a high probability of error occurrence among the variable nodes whose inversion function value $E_i$ is smaller than the threshold value T, and performing a bit flipping operation.

The variable node decision value managing element 1108 may update the decision values C of all variable nodes corresponding to all the columns forming the parity check matrix H based on information on the decision values for the selected variable nodes $V_i$. The variable node decision value managing element 1108 may provide the syndrome checking unit 1052 with information on the decision values C of the updated variable nodes.

According to the embodiment of the presently disclosed technology, when the updated decision values C of the variable nodes are different from the decision values C of the variable nodes before the updating operation, the variable node decision value managing element 1108 may set a non-update flag $N_F$ to 0. According to another embodiment of the presently disclosed technology, when the state variable $W_i$ is updated from a value of '0' to a value of '1' even though the inversion function $E_i$ is smaller than the threshold value T and thus no bit flipping operation is performed on the decision value C of the variable nodes, the variable node decision value managing element 1108 may set the non-update flag $N_F$ to 0. The initial value of the non-update flag $N_F$ may be 1. The variable node decision value managing element 1108 may check the value of the non-update flag $N_F$ every time one iteration unit of the LDPC decoding operation is performed for all the variable nodes corresponding to a column of the parity check matrix H. The variable node decision value managing element 1108 may terminate the LDPC decoding operation when the value of the non-update flag $N_F$ is 1.

According to the embodiment of the presently disclosed technology, the value of the non-update flag $N_F$ being 1 after the variable node updating operation is performed may be an indication of the decision value of the variable nodes according to the updating operation having not changed. Thus, the node decision value managing element 1108 may terminate the LDPC decoding operation.

Figure 12:
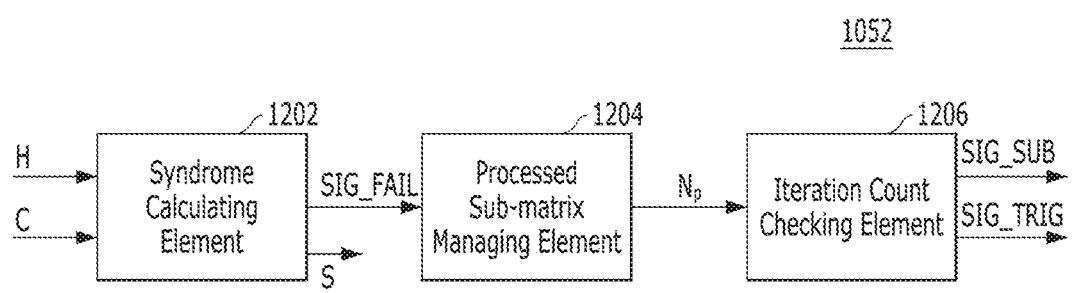
FIG. 12 is a block diagram illustrating an example structure of a syndrome checking unit 1052.

FIG. 12 is a block diagram illustrating an example structure of the syndrome checking unit 1052.

The syndrome checking unit 1052 may include a syndrome calculating element (or a syndrome calculator) 1202, a processed sub-matrix managing element (or a processed sub-matrix manager) 1204, and an iteration count checking element (or an iteration count checker) 1206.

The syndrome calculating element 1202 may calculate the syndrome S based on the provided information on the parity check matrix H and the decision value C of the variable nodes as shown in Equation 7.

$$S = H \cdot C \quad \text{Equation 7}$$

The syndrome calculating element 1202 may calculate the syndrome S which is formed of M*Q rows and one column by multiplying the parity check matrix H which is formed of M*Q rows and N*Q columns by the decision values C of the variable nodes which are formed of N*Q rows and one column. The syndrome calculating element 1202 may check whether all the entries forming the syndrome S have a value of 0 or not by obtaining a syndrome absolute value |S| based on the calculated syndrome S. The syndrome absolute value |S| may be calculated based on Equation 8.

$$|S| = \Sigma_i S_i \quad \text{Equation 8}$$

The syndrome calculating element 1202 may calculate the syndrome absolute value by adding up all the entries $S_i$ forming the syndrome S. When the syndrome absolute value |S| has a value of 0, the syndrome calculating element 1202 may determine that the codeword is successfully decoded and output the decision value C of the variable nodes. When the syndrome absolute value |S| is not 0, the syndrome calculating element 1202 may provide the check node updating unit 1054 with information on the syndrome S and provide the processed sub-matrix managing element 1204 with a failure signal SIG_FAIL.

The processed sub-matrix managing element 1204 may update the number $N_p$ of the processed variable nodes based on the provided failure signal SIG_FAIL. The processed sub-matrix managing element 1204 may update the number $N_p$ of the processed sub-matrices by adding the rational number z, which is a size of the basic processing unit P divided by the number of variable nodes included in each of the sub-matrices Q, to the number $N_p$ of the processed sub-matrices, as described above with reference to Equation 3. In other words, the processed sub-matrix managing element 1204 may increase the number $N_p$ of the processed variable nodes whenever the variable node selecting unit 1056 selects up to P variable nodes $V_i$, where P is the size of the basic processing unit, and the variable node updating unit 1050 updates the decision value $C_i$ of the selected variable nodes $V_i$. The processed sub-matrix managing element 1204 may provide information on the updated number $N_p$ of the processed variable nodes to the iteration count checking unit 1206 and the check node updating unit 1054.

The iteration count checking element 1206 may check whether the current iteration count has reached the maximum iteration count $I_M$ or not based on the provided information on the number $N_p$ of the processed sub-matrices. When the number $N_p$ of the processed sub-matrices reaches a value obtained by multiplying the maximum iteration count $I_M$ by the number N of the sub-matrices included in a unit row of the parity check matrix H, the iteration count checking element 1206 may terminate the LDPC decoding and output a decoding failure. If the number $N_p$ of the processed sub-matrices has not reached a value obtained by multiplying the maximum iteration count $I_M$, by the number N of the sub-matrices included in a unit row of the parity check matrix H, the iteration count checking element 1206 may increase the sub-iteration index k by one.

In some embodiments, the iteration count checking element 1206 may check whether the sub-iteration index k has reached the maximum sub-iteration count $I_m$ or not. If the sub-iteration index k has not reached the maximum sub-iteration count $I_m$, the iteration count checking element 1206 may provide the variable node selecting unit 1056 with the sub-iteration signal SIG_SUB, and update the variable nodes up to a size of the processing unit by repeating operations of the one sub-iteration unit, which includes a variable node selecting operation, a variable node updating operation, and a syndrome checking operation, up to the maximum sub-iteration count. When the sub-iteration index k reaches the maximum sub-iteration count $I_m$, the iteration count checking element 1206 may provide the check node updating unit 1054 with a trigger signal SIG_TRIG to update the backup syndrome $S_p$, the processing unit $P_c$, and the threshold value T.

According to some embodiments of the presently disclosed technology, the maximum sub-iteration count $I_m$ may be a value obtained by dividing the processing unit $P_c$ by the basic processing unit P, (e.g., a size of the processing unit divided by a size of the basic processing unit, $P_c/P$) Accordingly, the smaller the size of the processing unit $P_c$ is, the more frequently the iteration count checking element 1206 may perform a control to update the backup syndrome $S_p$, the processing unit $P_c$ and the threshold value T, thus improving the error correction performance.

Figure 13:
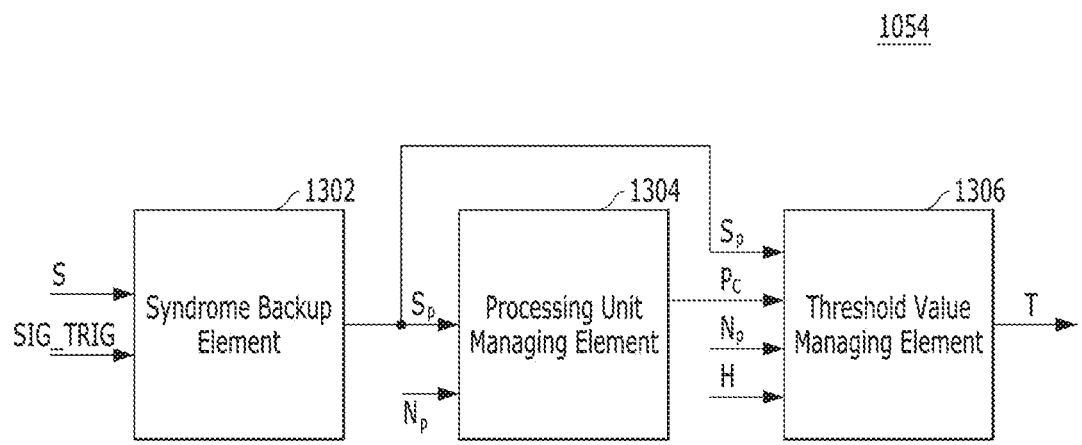
FIG. 13 is a block diagram illustrating an example structure of a check node updating unit 1054.

FIG. 13 is a block diagram illustrating an example structure of the check node updating unit 1054.

The check node updating unit 1054 may include a syndrome backup element (or a syndrome backup) 1302, a processing unit managing element (or a processing unit manager) 1304, and a threshold value managing element (or a threshold value manager) 1306.

The syndrome backup element 1302 may update the backup syndrome $S_p$ based on the provided information on the syndrome S. The syndrome backup element 1302 may update the backup syndrome $S_p$ such that the entries forming the backup syndrome $S_p$ have the same values as the entries forming the syndrome S. The number of the entries having a value of 1 among the entries forming the backup syndrome $S_p$ may be equal to the number of the unsatisfied check nodes UCN existing at the moment when the backup syndrome $S_p$ is updated. The syndrome backup element 1302 may provide information on the backup syndrome $S_p$ to the processing unit managing element 1304 and the threshold value managing element 1306.

The processing unit managing unit 1304 may obtain the processing unit $P_c$ that determines when the threshold value T and the backup syndrome $S_p$ are updated. As described above with reference to FIG. 9, the basic processing unit P may be the number of variable nodes capable of performing an LPDC decoding operation in parallel. The processing unit $P_c$ may be a value obtained by multiplying the basic processing unit P by the maximum sub-iteration count $I_m$, and the processing unit managing element 1304 may update the processing unit $P_c$ every time the decision values C of the variable nodes, up to a size of the previous processing unit $P_c'$, are updated by iteratively performing operations of the one sub-iteration unit, which include a variable node selecting operation, a bit flipping operation, and a syndrome checking operation. The processing unit managing element 1304 may obtain a value by dividing the processing unit $P_c$ by the basic processing unit P and determine the obtained value as the maximum sub-iteration count $I_m$.

The processing unit managing element 1304 may update the processing unit $P_c$ based on the provided information on the number $N_p$ of the processed variable nodes and the backup syndrome $S_p$. The previous processing unit $P_c'$ indicates the processing unit $P_c$ in the previous sub-iteration unit. According to the embodiment of the presently disclosed technology, the processing unit managing element 1304 may update the processing unit $P_c$ based on the range of the number $N_p$ of the processed variable nodes, which is shown in Equation 9.

$$P_c = \begin{cases} n, & N_p < 2N \text{(case 1)} \\ 2Q, & N_p \geq 2N \text{(case 2)} \end{cases} \quad \text{Equation 9}$$

The processing unit managing element 1304 may determine the processing unit $P_c$ to be the number n of all the variable nodes that form the parity check matrix H, when the number $N_p$ of the processed variable nodes is smaller than twice the number N of the sub-matrices included in a unit row of the parity check matrix H.

As described above, the number n of all the variable nodes that form the parity check matrix H may be the same as a value that is obtained by multiplying the number N of the sub-matrices forming the unit row of the parity check matrix H by the number Q of the variable nodes corresponding to the columns that form the sub-matrix 802. If the number $N_p$ of the processed variable nodes is equal to or greater than twice the number N of the sub-matrices included in the unit row of the parity check matrix H, the processing unit managing element 1304 may determine the processing unit $P_c$ as a value obtained by doubling the number Q of the variable nodes that form the sub-matrix 802. The processing unit managing element 1304 may provide the threshold value managing element 1306 with information on the updated processing unit $P_c$.

According to the embodiment of the presently disclosed technology, if the number $N_p$ of the processed variable nodes has a small value, the processing unit managing element 1304 may increase the size of the processing unit $P_c$. Conversely, if the number $N_p$ of the processed variable nodes has a large value, the processing unit managing element 1304 may decrease the size of the processing unit $P_c$. For example, the processing unit managing element 1304 may decrease the number of times that the backup syndrome $S_p$ and the threshold value T are updated in the initial stage of an LDPC decoding operation, and when the number $N_p$ of the processed variable nodes reaches a predetermined threshold value, the processing unit managing element 1304 may improve the error correction performance by increasing the number of times that the backup syndrome $S_p$ and the threshold value T are updated.

The threshold value managing element 1306 may update the threshold value T based on the provided information on the processing unit $P_c$, the number of the processed variable nodes $N_p$, and the backup syndrome $S_p$. According to the embodiment of the presently disclosed technology, the threshold value managing element 1306 may obtain the threshold value T based on the backup syndrome absolute value $|S_p|$. The backup syndrome absolute value $|S_p|$ may be calculated as shown in Equation 10.

$$|S_p| = \Sigma_i S_{pi} \quad \text{Equation 10}$$

The threshold value managing element 1306 may obtain the backup syndrome absolute value $|S_p|$ by adding up all the values of the entries $S_{pi}$ that form the backup syndrome $S_p$. The backup syndrome absolute value $|S_p|$ may be equal to the number of the unsatisfied check nodes UCN. The threshold value managing element 1306 may determine the threshold value T based on comparing the backup syndrome absolute value $|S_p|$ to multiple thresholds, as shown in Equation 11.

$$T = \begin{cases} \lambda_{max} - 3, & |S_p| < T_1 \text{(case 1)} \\ \lambda_{max} - 2, & T_1 \leq |S_p| < T_2 \text{(case 2)} \\ \lambda_{max} - 1, & T_2 \leq |S_p| < T_3 \text{(case 3)} \\ \lambda_{max}, & |S_p| \geq T_3 \text{(case 4)} \end{cases} \quad \text{Equation 11}$$

The threshold value managing element 1306 may obtain a maximum variable node degree $\lambda_{max}$ based on the information on the parity check matrix H. The maximum variable node degree $\lambda_{max}$ may be the number of the check nodes connected to the variable node that is (a) selected from among the variable nodes corresponding to a column of the parity check matrix H, and (b) connected to the largest number of check nodes. The threshold value managing element 1306 may measure the number of entries having a value of 1 among the entries included in each column of the parity check matrix H for each column, and determine the number of entries having a value of 1 in the column that includes the largest number of entries having a value of 1 to be the maximum variable node degree $\lambda_{max}$.

According to the embodiment of the presently disclosed technology, and as shown in Equation 11, when the backup syndrome absolute value $|S_p|$ is smaller than a first threshold value the threshold value managing element 1306 may determine a value which is smaller than the maximum variable node degree $\lambda_{max}$ by 3 to be the threshold value T. When the backup syndrome absolute value $|S_p|$ is greater than or equal to the first threshold value $T_1$ and smaller than a second threshold value $T_2$, the threshold value managing element 1306 may determine a value which is smaller than the maximum variable node degree $\lambda_{max}$ by 2 to be the threshold value T. When the backup syndrome absolute value $|S_p|$ is greater than or equal to the second threshold value $T_2$ and smaller than a third threshold value $T_3$, the threshold value managing element 1306 may determine a value which is smaller than the maximum variable node degree $\lambda_{max}$ by 1 to be the threshold value T. When the backup syndrome absolute value $|S_p|$ is greater than or equal to the third threshold value $T_3$, the threshold value managing element 1306 may determine the maximum variable node degree $\lambda_{max}$ to be the threshold value T.

According to the embodiment of the presently disclosed technology, when the number of unsatisfied check nodes UCN (and equivalently, the backup syndrome absolute value $|S_p|$) is large, the threshold value managing element 1306 may increase the size of the threshold value T, and when the backup syndrome absolute value $|S_p|$ becomes small, the threshold value managing element 1306 may decrease the size of the threshold value T. Based on the difference between the decision value C of the current variable nodes and the decision value of a successful decoding, the threshold value managing element 1306 may improve the error correction performance by performing a bit-flipping operation on a smaller number of variable nodes.

Figure 14:
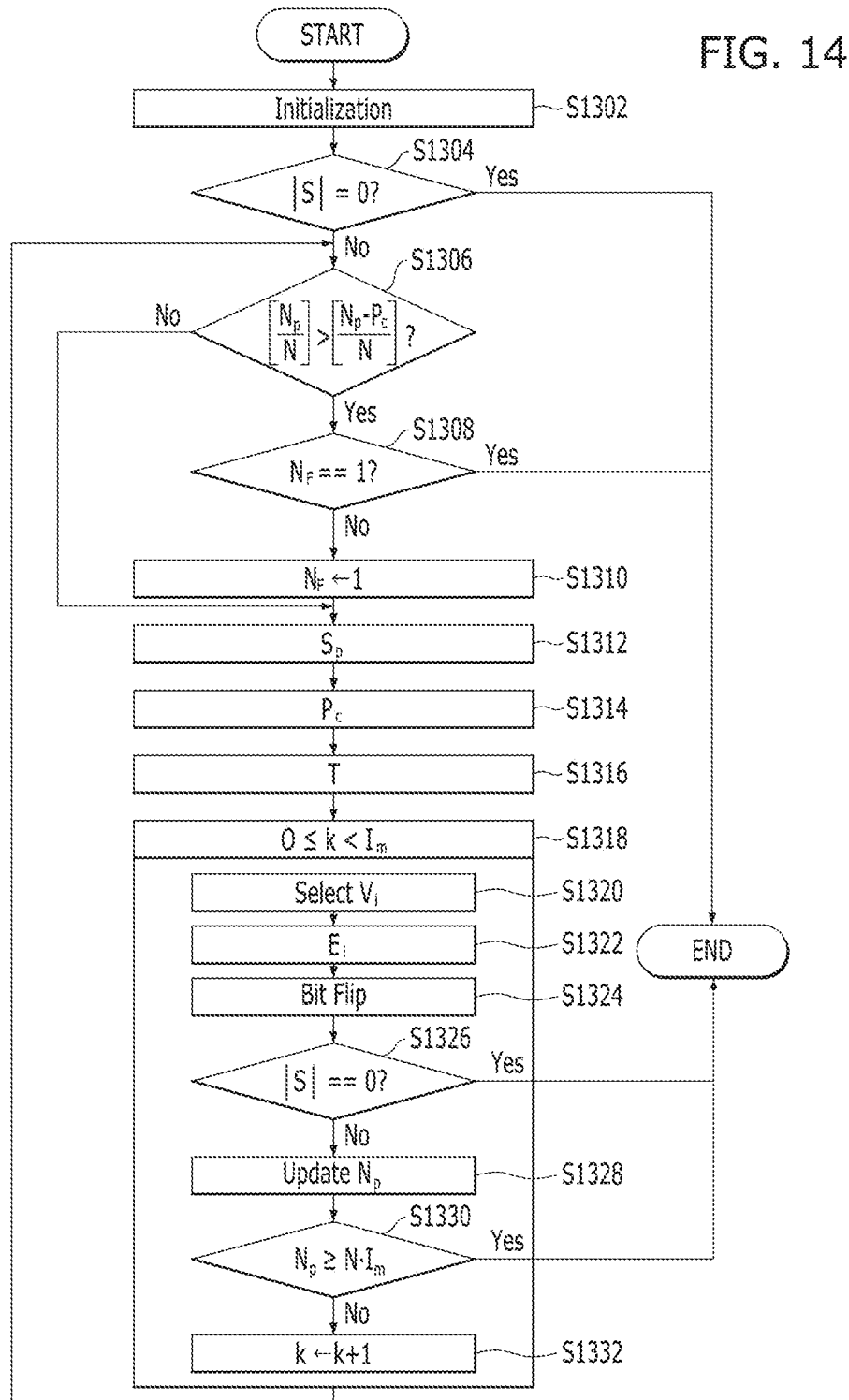
FIG. 14 is a flowchart describing an example of LDPC decoding operation performed in a semiconductor system 10 in accordance with an embodiment of the presently disclosed technology.

FIG. 14 is a flowchart describing an example LDPC decoding operation performed in a semiconductor system 10 in accordance with an embodiment of the presently disclosed technology.

In step S1302, the LDPC decoder 133 may perform an initialization operation. The channel message managing unit 1004 may obtain a hard decision value R for the variable nodes based on a codeword that is read from the semiconductor memory device 200 and provide the variable node updating unit 1050 with the hard decision value R. The variable node updating unit 1050 may initialize a decision value of variable nodes with the provided hard decision value R. Also, the processing unit managing element 1304 may initialize the size of the processing unit $P_c$ with the size of the basic processing unit P. As described above with reference to FIG. 9, the size of the basic processing unit P may equal the number of variable nodes capable of performing an LPDC decoding operation in parallel. Also, the processed sub-matrix managing element 1204 may initialize the number $N_p$ of the processed sub-matrices to 0, and the variable node decision value managing element 1108 may initialize the non-update flag $N_F$ to 1.

In step S1304, the syndrome calculating element 1202 may calculate the syndrome S based on the initialized decision value C of the variable nodes in the step S1302 and the parity check matrix H. The syndrome calculating element 1202 may calculate the syndrome S by multiplying the parity check matrix H by the initialized decision value C of the variable nodes, as in Equation 7. When all the entries included in the calculated syndrome S have a value of 0 ('Y' in the step S1304), the syndrome calculating element 1202 may terminate the LDPC decoding operation and output the initialized decision value C of the variable nodes.

In step S1306, when one or more entries among the entries included in the calculated syndrome S have a value of 1 ('N' in the step S1304), the processed sub-matrix managing element 1204 may determine whether one iteration of performing an LDPC decoding operation on all the variable nodes corresponding to a column of the parity check matrix H is performed or not. According to the embodiment of the presently disclosed technology, when a first result value output is obtained from a Gaussian notation by inputting a value which is obtained by dividing the number $N_p$ of the processed sub-matrices by the number N of the sub-matrices included in a unit row of the parity check matrix H into the Gaussian notation is greater than a second result value outputted from the Gaussian notation by inputting a value which is obtained by dividing the difference between the number $N_p$ of the processed sub-matrices and the processing unit $P_c$ by the number N of the sub-matrices included in a unit row of the parity check matrix H into the Gaussian notation, the processed sub-matrix managing element 1204 may determine that the one iteration unit is performed.

In the step S1306, when the processed sub-matrix managing element 1204 determines that the one iteration unit is performed ('Y' in the step S1306), the processed sub-matrix managing element 1204 may check whether the non-update flag $N_F$ has a value of 1 or not. For example, when the decision value C of the variable nodes updated in step S1324 is differ from the decision value C of the variable nodes before the updating operation, the processed sub-matrix managing element 1204 may set the non-update flag $N_F$ to 0. When the value of the non-update flag $N_F$ is 1 ('Y' in the step S1308), the processed sub-matrix managing element 1204 may terminate the LDPC decoding operation.

According to the embodiment of the presently disclosed technology, if the value of the non-update flag $N_F$ is 1 even after the operation of updating the variable node in step S1324 is performed, this may indicate that the decision value C of the variable nodes has not changed after the updating operation. Therefore, the processed sub-matrix managing element 1204 may terminate the LDPC decoding operation. If the value of the non-update flag $N_F$ is 0 ('N' in the step S1308), the processed sub-matrix managing element 1204 may update the value of the non-update flag $N_F$ to 1 in step S1310.

In step S1312, the syndrome backup element 1302 may separately store the syndrome S, which is calculated in step S1304, as the backup syndrome $S_p$. For example, the inversion function evaluating element 1104 may calculate the inversion function value $E_i$ of the selected variable nodes $V_i$ while one iteration is performed based on the backup syndrome $S_p$, rather than the syndrome $S_p$ which is updated for each sub-iteration. Also, as described above, the backup syndrome $S_p$ may indicate the number of unsatisfied check nodes UCN.

In step S1314, the processing unit managing element 1304 may obtain the processing unit $P_c$ based on the backup syndrome $S_p$, the number $N_p$ of the processed variable nodes, and the previous processing unit $P_c$. The processing unit managing element 1304 may obtain a value by dividing the processing unit $P_c$ by the basic processing unit P and determining the obtained value as the maximum sub-iteration count $I_m$.

According to the embodiment of the presently disclosed technology, the processing unit managing element 1304 may determine the processing unit $P_c$ based on the number $N_p$ of the processed variable nodes, as in Equation 7. When the number $N_p$ of the processed variable nodes is smaller than twice the number N of the sub-matrices that are included in a unit row of the parity check matrix H, the processing unit managing element 1304 may determine the processing unit $P_c$ as the number n of all the variable nodes that form the parity check matrix H. As described above, the number n of all the variable nodes that form the parity check matrix H may be the same as a value obtained by multiplying the number N of the sub-matrices forming the unit row of the parity check matrix H by the number Q of the variable nodes forming the sub-matrices 802. When the number $N_p$ of the processed variable nodes is equal to or greater than twice the number N of the sub-matrices that are included in the unit rows of the parity check matrix H, the processing unit managing element 1304 may obtain a value by doubling the number Q of the variable nodes forming the sub-matrices 802 and determine the obtained value as the processing unit $P_c$.

In step S1316, the threshold value managing element 1306 may obtain a threshold value T based on the processing unit $P_c$, the number $N_p$ of the processed variable nodes, and the backup syndrome $S_p$. According to the embodiment of the presently disclosed technology, the threshold value managing element 1306 may determine the threshold value T based on the backup syndrome absolute value $|S_p|$, as in Equation 11. When the backup syndrome absolute value $|S_p|$ is smaller than the first threshold value $T_1$, the threshold value managing element 1306 may determine a value which is smaller by 3 than the maximum variable node degree $\lambda_{max}$ to be the threshold value T. As described above, the maximum variable node degree $\lambda_{max}$ may be the number of the check nodes connected to a variable node connected to the largest number of check nodes among the variable nodes corresponding to the column of the parity check matrix H. When the backup syndrome absolute value $|S_p|$ is equal to or greater than the first threshold value $T_1$ and smaller than the second threshold value $T_2$, the threshold value managing element 1306 may determine a value which is smaller by 2 than the maximum variable node degree $\lambda_{max}$ to be the threshold value T. When the backup syndrome absolute value $|S_p|$ is equal to or greater than the second threshold value and smaller than the third threshold value $T_3$, the threshold value managing element 1306 may determine a value which is smaller by 1 than the maximum variable node degree $\lambda_{max}$ be the threshold value T. When the backup syndrome absolute value $|S_p|$ is equal to or greater than the third threshold value $T_3$, the threshold value managing element 1306 may determine the maximum variable node degree $\lambda_{max}$ to be the threshold value T.

In step S1318, the LPDC decoder 133 may perform a sub-iteration unit including the variable node selecting operation of the step S1320, the inversion function generating operation of the step S1322, the bit-flipping operation of the step S1324, the syndrome checking operation of the step S1326, the operation of updating the number $N_p$ of the processed sub-matrices of the step S1328, and the operation of checking the maximum iteration count of the step S1330. In step S1328, the initial value of the sub-iteration count k may have a value of 0.

In step S1320, the variable node selecting unit 1056 may select variable nodes corresponding to the column of the parity check matrix H based on the basic processing unit P. The variable node selecting unit 1056 may obtain a current sub-matrix index $i_c$ based on Equation 1. The variable node selecting unit 1056 may obtain the current sub-matrix index $i_c$ by performing a modulo operation on the number $N_p$ of the processed sub-matrices and the number N of the sub-matrices that are included in the unit row of the parity check matrix H.

The variable node selecting unit 1056 may obtain a value by multiplying the current sub-matrix index $i_c$ in by the number Q of columns forming the sub-matrix 802 and determine the obtained value as the first index of the selected variable nodes, and sequentially calculate the subsequent indices in an ascending order. The variable node selecting unit 1056 may obtain a first value by multiplying the number Q of the columns forming the sub-matrix 802 by the current sub-matrix index $i_c$, obtain a second value by adding the basic processing unit P to the first value so as to produce an addition result and subtracting 1 from the addition result, determine the obtained second value as the last index, and select the variable nodes as many as the basic processing unit P.

In step S1322, the inversion function evaluating element 1104 may calculate the inversion function value $E_i$ of the selected variable nodes $V_i$ based on the backup syndrome $S_p$, the decision value $C_i$ of the selected variable nodes, and the hard decision value $R_i$ of the selected variable nodes $V_i$. According to the embodiment of the presently disclosed technology, the inversion function evaluating element 1104 may calculate the inversion function value $E_i$ of the selected variable nodes $V_i$ as shown in the above Equation 4. The inversion function evaluating element 1104 may calculate the inversion function value $E_i$ of the selected variable nodes $V_i$ by obtaining a first value by performing an inner product operation on the previous backup syndrome $S_p'$ and the entries included in the columns of the parity check matrix H corresponding to the selected variable nodes $V_i$, obtaining a second value by, performing an XOR operation on the decision value $C_i$ of the selected variable nodes and the hard decision value $R_i$ of the selected variable nodes, and then adding up the first value and the second value.

In step S1324, the bit-flipping element 1106 may perform a bit-flipping operation based on the threshold value T and the inversion function value $E_i$ of the selection variable nodes $V_i$. According to the embodiment of the presently disclosed technology, the bit-flipping element 1106 may perform the bit-flipping operation by inverting the decision value $C_i$ of the variable nodes $V_i$ having an inversion function value $E_i$ which is greater than the threshold value T as shown in Equation 5. In another example, the bit-flipping element 1106 may perform a bit-flipping operation on the variable nodes by performing an XOR operation on 1 and the decision value $C_i$ of the variable nodes having the inversion function value $E_i$ which is equal to or greater than the threshold value T. In yet another example, the bit-flipping element 1106 may maintain the existing decision value for the decision value $C_i$ of the variable nodes having the inversion function value $E_i$ which is smaller than the threshold value T.

According to another embodiment of the presently disclosed technology, the bit-flipping element 1106 may perform a bit flipping operation in consideration of not only the inversion function value $E_i$ but also a state variable $W_i$, as shown in Equation 6. The bit-flipping element 1106 may set the state variable $W_i$ of the variable nodes whose inversion function value $E_i$ is equal to or greater than a predetermined threshold value among the variable nodes that the bit-flipping operation is not performed for a predetermined number of iteration units to 1. The bit-flipping element 1106 may invert the decision value $C_i$ of the variable nodes whose state variable $W_i$ is 1 among the variable nodes $V_i$ having an inversion function value $E_i$ which is smaller than the threshold value T, as in Equation 12.

The bit-flipping element 1106 may perform a bit flipping operation on the variable nodes by performing an XOR operation on 1 and the decision value $C_i$ of the variable nodes whose inversion function value $E_i$ is greater than the threshold value T. The bit-flipping element 1106 may perform a bit flipping operation on the variable nodes having an inversion function value which is smaller than the threshold value T and smaller than the threshold value T by 1, and having a state variable $W_i$ which is 1. The bit-flipping element 1106 may maintain the existing decision value for the variable nodes having an inversion function value $E_i$ which is smaller than the threshold value T and smaller than the threshold value T by 1, and having a state variable $W_i$ which is 0, and may update the state variable $W_i$ to 1 by performing an XOR operation on 1 and the state variable $W_i$. The bit-flipping element 1106 may maintain the existing decision value for the variable nodes having an inversion function value $E_i$ which is smaller than the threshold value T and greater than the threshold value T by 1.

In step S1324, the variable node decision value managing element 1108 may update the decision values C of all variable nodes based on the inverted decision values $C_i$ of the selected variable nodes $V_i$. The variable node decision value managing element 1108 may provide the syndrome checking unit 1052 with information on the updated decision values C of all the variable nodes.

According to the embodiment of the presently disclosed technology, when the updated decision values C of the variable nodes are different from the decision values C of the variable nodes before the updating operation, the variable node decision value managing element 1108 may set a non-update flag $N_F$ to 0. In the step S1306, the value of the non-update flag $N_F$ is checked for each one iteration unit, and when the value of the non-update flag $N_F$ is 1, the variable node decision value managing element 1108 may terminate the LDPC decoding operation. According to the embodiment of the presently disclosed technology, when the value of the non-update flag $N_F$ is 1, even after a variable node updating operation is performed, it may mean that the decision values of the variable nodes are not changed after the updating operation. Therefore, the bit-flipping element 1106 may terminate the LDPC decoding operation.

In step S1326, the syndrome calculating element 1202 may update the syndrome S by multiplying the parity check matrix H by the updated decision value C of the variable nodes, as in Equation 7. The syndrome calculating element 1202 may determine whether all the entries of the syndrome S have a value of 0 by calculating the syndrome absolute value |S|, as in Equation 8. When the syndrome absolute value |S| is equal to 0 ('Y' in step S1330), the syndrome calculating element 1202 may determine that the decoding operation is successful and output the updated decision value C of the variable nodes.

In step S1328, when the syndrome absolute value |S| is not 0 ('N' in the step S1330), the processing unit managing element 1304 may update the number $N_p$ of the processed sub-matrices based on the above Equation 9. The processing unit managing element 1304 may update the number $N_p$ of the processed sub-matrices into a value obtained by adding the rational number z, which is a size of the basic processing unit P divided by the number of variable nodes included in each of the sub-matrices Q, to the number $N_p$ of the processed sub-matrices. The processing unit managing element 1304 may provide the iteration count checking element 1206 with information on the number $N_p$ of the processed sub-matrices.

In step S1330, it is checked whether the current iteration count has reached the maximum iteration count $I_M$ or not based on the number $N_p$ of the processed sub-matrices. If the number $N_p$ of the processed sub-matrices has reached a value obtained by multiplying the maximum iteration count $I_M$ by the number N of the columns of the sub-matrices included in the unit row of the parity check matrix 800 ('Y' in the step S1330), the iteration count checking element 1206 may determine that the current iteration count has reached the maximum iteration count $I_M$, terminate the LDPC decoding operation, and output a decoding failure. However, if the number $N_p$ of the processed sub-matrices has not reached a value obtained by multiplying the maximum iteration count $I_M$ by the number N of the columns of the sub-matrices included in the unit row of the parity check matrix 800 ('N' in the step S1330), the iteration count checking element 1206 may increase the sub-iteration index k by 1 in step S1332.

Figure 15:
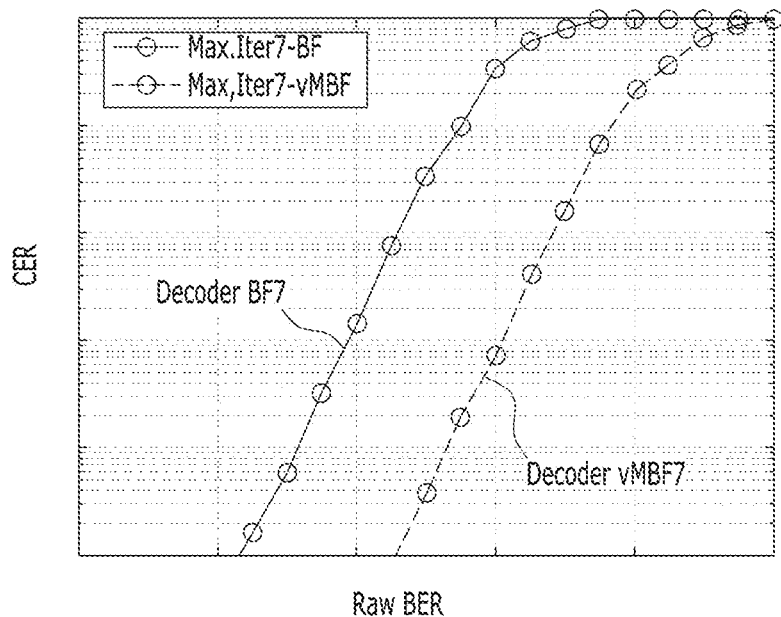
FIG. 15 is a graph showing an exemplary operation simulation result of the LDPC decoder 133 in accordance with the embodiment of the presently disclosed technology.

In step S1332, the iteration count checking element 1206 may check whether the sub-iteration index k has reached the maximum sub-iteration count $I_m$ or not. The iteration count checking element 1206 may return to the step S1306 to update the backup syndrome $S_p$, the processing unit $P_c$, and the threshold value T, if the sub-iteration index k has reached the maximum sub-iteration count $I_m$. According to the embodiment of the presently disclosed technology, the maximum sub-iteration count $I_m$ may be a value obtained by dividing the processing unit $P_c$ the basic processing unit P. Therefore, as the size of the processing unit $P_c$ is smaller, the iteration count checking element 1206 may perform a control to update the update backup syndrome $S_p$, the processing unit $P_c$, and the threshold value T more frequently in order to improve the error correction performance, FIG. 15 is a graph showing an exemplary operation simulation result of the LDPC decoder 133 in accordance with the embodiment of the presently disclosed technology.

The graph shows chunk error rates (CER) based on the raw bit error rates (RBER) of an LDPC decoder Decoder$_{BF7}$ according to an existing implementation having a maximum iteration count of 7, and an LDPC decoder Decoder$_{Proposed\_BF7}$ in accordance with the presently disclosed technology having a maximum iteration count of 7. The LDPC decoder Decoder$_{Proposed\_BF7}$ having the maximum iteration count of 7 has a lower chunk error rate (CER) than the LDPC decoder Decoder$_{BF7}$ according to the prior art having the maximum iteration count of 7. Therefore, the LDPC decoder Decoder$_{Proposed\_BF7}$ has an improved error correction performance over the error correction performance of the LDPC decoder Decoder$_{BF7}$ under the condition that the maximum iteration count is the same.

According to the embodiment of the presently disclosed technology, the data stored in a memory cell of a semiconductor memory device may be decoded quickly and accurately.

While the disclosed technology has been shown and described with reference to certain exemplary embodiments thereof, it will be understood by those skilled in the art that various changes in form and details may be made therein without departing from the spirit and scope of the disclosed technology as defined by the appended claims and their equivalents. Therefore, the scope of the disclosed technology should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the disclosed technology, and the disclosed technology is not limited thereto. That is, it should be apparent to those skilled in the art that various modifications can be made on the basis of the technological scope of the disclosed technology.

Meanwhile, the exemplary embodiments of the disclosed technology have been described in the drawings and specification. Although specific terminologies are used here, those are only to explain the embodiments of the disclosed technology. Therefore, the disclosed technology is not restricted to the above-described embodiments and many variations are possible within the spirit and scope of the disclosed technology. It should be apparent to those skilled in the art that various modifications can be made on the basis of the technological scope of the disclosed technology in addition to the embodiments disclosed herein.

What is claimed is:

1. A semiconductor memory system, comprising:
a semiconductor memory device to store a codeword comprising a plurality of sub-matrices; and
a low-density parity check (LDPC) decoder to decode the codeword, based on a parity check matrix, to generate a decoded codeword,
wherein the LDDC decoder includes:
a selector to select one or more sub-matrices of the plurality of sub-matrices that share the same layer index of the parity check matrix, and select variable nodes corresponding to columns included in the selected one or more sub-matrices based on a threshold old value and a number of unsatisfied check nodes (UCNs) connected to the selected variable nodes;
a variable node updater to update decision values of variable nodes corresponding to all columns included in the parity check matrix by inverting decision values of the selected variable nodes, wherein inverting a decision value comprises flipping a zero value to a one value, or a one value to a zero value;
a syndrome checker to determine whether decoding the codeword has been performed successfully or not by multiplying the updated decision values of the variable nodes by the parity check matrix; and
a check node updater to update a backup syndrome, the threshold value, and a size of a processing unit upon a determination that a sub-iteration operation has been performed $I_m$ times,
wherein the size of the processing unit is $P \times I_m$,
wherein $I_m$ is a maximum sub-iteration count,
wherein P is the number of variable nodes that may perform an LDPC decoding operation in parallel, and
wherein the sub-iteration operation comprises selecting the one or more sub-matrices, updating the decision values of variable nodes, and determining whether decoding the codeword has been performed successfully or not.

2. The semiconductor memory system of claim 1, wherein the sub-iteration operation is performed on variable nodes corresponding to all the columns that form the parity check matrix as one iteration operation, and wherein the LDPC decoder is configured to perform the one iteration operation $I_M$ times or until the codeword is successfully decoded, and wherein $I_M$ is a maximum iteration count.

3. The semiconductor memory system of claim 1, wherein the WPC decoder further includes:
a parity check matrix manager store information on the parity check matrix; and
a channel message manager to generate a hard decision value based on the codeword.

4. The semiconductor memory system of claim 1, wherein the variable node updater includes:
an inversion function evaluator to generate an inversion function based on the backup syndrome and a hard decision value for the selected variable nodes;
a bit-flipping element to invert the decision values of the selected variable nodes based on the inversion function and the threshold value; and
a variable node decision value manager to update the decision values of the variable nodes corresponding to all the columns that form the parity check matrix based on the inverted decision values of the variable nodes.

5. The semiconductor memory system of claim 2, wherein the syndrome checking unit includes:
a syndrome calculator to calculate a syndrome by multiplying the parity check matrix by the decision values of the variable nodes and determining whether the decoding operation is performed successfully or not;
a processed sub-matrix manager to update a number of processed variable nodes by adding a number of previously processed sub-matrices and a rational number (z), which is the number of variable nodes, that may perform an LDPC decoding operation in parallel (P), divided by the number of variable nodes included in each of the sub-matrices; and
an iteration counter to update the backup syndrome, the threshold value, and the size of the processing unit upon a determination that (a) the sub-iteration operation has been performed $I_m$ times, and (b) the one iteration operation has been performed $I_M$ times, thereby terminating the decoding operation.

6. The semiconductor memory system of claim 1, wherein the check node updating unit includes:
   a syndrome backup element to update a backup syndrome upon a determination that the sub-iteration operation has been performed m times;
   a processing unit manager to update the size of the processing unit based on the updated backup syndrome; and
   a threshold value manager to update the threshold value such that the threshold value is proportional to an absolute value of the backup syndrome based on the updated backup syndrome, the parity check matrix, the updated size of the processing unit, and the number of the processed variable nodes.

7. The semiconductor memory system of claim 1, wherein the variable node updating unit is configured to obtain a current sub-matrix index by performing a modulo operation on the number of the processed sub-matrices using the number of sub-matrices included in a unit row of the parity check matrix.

8. The semiconductor memory system of claim 4, wherein the inversion function evaluating element is configured to generate the inversion function by adding
   the number of unsatisfied check nodes connected to the selected variable nodes and
   a value obtained by performing an XOR operation on the decision values and the hard decision values of the selected variable nodes.

9. The semiconductor memory system of claim 4, wherein the bit-flipping element is configured to invert the decision values upon a determination that the inversion function of the selected variable nodes is greater than or equal to the threshold value.

10. The semiconductor memory system of claim 4, wherein the bit-flipping element is configured invert the decision values upon a determination that an inversion function of the selected variable nodes is smaller than the threshold value, a difference between the inversion function of the selected variable nodes and the threshold value is smaller than a predetermined threshold, and inverting the decision values has not been performed for a predetermined iteration count.

11. The semiconductor memory system of claim 4, wherein the variable node decision value manager is configured to terminate the decoding operation based on a non-update flag upon a determination that the updated decision values of the variable nodes are equal to decision values of the variable nodes before the updating is performed.

12. The semiconductor memory system of claim 6, wherein the processing unit manager is configured to decrease $I_m$ upon a determination that the number of the processed variable nodes is equal to a predetermined threshold.

13. A method for operating a semiconductor memory system, the semiconductor memory system storing a codeword comprising a plurality of sub-matrices, the method comprising:
   selecting one or more sub-matrices of the plurality of sub-matrices that share the same layer index of a parity check matrix and selecting variable nodes corresponding to columns included in the selected one or more sub-matrices based on a threshold value and a number of unsatisfied check nodes (UCNs) connected to the selected variable nodes;
   updating decision values of variable nodes corresponding to all columns included in the parity check matrix by inverting decision values of the selected variable nodes, wherein inverting a decision value comprises flipping a zero value to a one value, or a one value to a zero value;
   determining whether decoding the codeword has been performed successfully or not by multiplying the updated decision values of the variable nodes by the parity check matrix; and
   updating a backup syndrome, the threshold value, and a size of a processing unit upon a determination that a sub-iteration operation has been performed $I_m$ times,
   wherein the size of the processing unit is $P \times I_m$,
   wherein $I_m$ is a maximum sub-iteration count,
   wherein P is the number of variable nodes that may perform an LDPC decoding operation in parallel, and
   wherein the sub-iteration operation comprises the selecting the one or more sub-matrices, the updating the decision values, and determining whether decoding the codeword has been performed successfully or not.

14. The method of claim 13, wherein the sub-iteration operation is performed on variable nodes corresponding to all the columns that form the parity check matrix as one iteration operation, and wherein the one iteration operation is performed $I_M$ times or until the codeword is successfully decoded, and wherein $I_M$ is a maximum iteration count.

15. The method of claim 13, further comprising:
   storing information on the parity check matrix; and
   generating a hard decision value based on the codeword.

16. The method of claim 13, wherein updating the decision values includes:
   generating an inversion function based on the backup syndrome and a hard decision value for the selected variable nodes;
   inverting the decision values of the selected variable nodes based on the inversion function and the threshold value; and
   updating the decision values of the variable nodes corresponding to all the columns that form the parity check matrix based on the inverted decision values of the variable nodes.

17. The method of claim 14, wherein the syndrome checking operation to determine whether the codeword is decoded successfully or not includes:
   calculating a syndrome by multiplying the parity check matrix by the decision values of the variable nodes and determining whether the decoding operation is performed successfully or not;
   updating the number of processed variable nodes by adding a number of previous processed sub-matrices and a rational number (z), which is the number of variable nodes, that may perform an LDPC decoding operation in parallel (P), divided by the number of variable nodes included in each of the sub-matrices; and
   updating the backup syndrome, the threshold value, and the size of the processing unit upon a determination that (a) the sub-iteration operation has been performed $I_m$ times, and (b) the one iteration operation is performed Lu times, thereby terminating the decoding operation.

18. The method of claim 13, wherein updating the backup syndrome, the threshold value, and the size of the processing unit includes:

updating a backup syndrome upon a determination that the sub-iteration operation has been performed $I_m$ times;

updating the size of the processing unit based on the updated backup syndrome; and updating the threshold value such that the threshold value is proportional to an absolute value of the backup syndrome based on the updated backup syndrome, the parity check matrix, an updated size of the processing unit, and the number of the processed variable nodes.

19. The method of claim 13, wherein selecting the sub-matrices that share the same layer index of the parity check matrix includes:

obtaining a current sub-matrix index by performing a modulo operation on the number of the processed sub-matrices using the number of sub-matrices included in a unit row of the parity check matrix.

20. The method of claim 16, wherein generating the inversion function includes adding the number of unsatisfied check nodes connected to the selected variable nodes and a value obtained by performing an XOR operation on the decision values and the hard decision value of the selected variable nodes.

21. The method of claim 16, wherein inverting the decision values is based on the inversion function of the selected variable nodes being equal to or greater than the threshold value.

22. The method of claim 16, wherein inverting the decision values is based on the inversion function of the selected variable nodes being smaller than the threshold value, and a difference between the inversion function of the selected variable nodes and the threshold value being smaller than a predetermined threshold, and the inverting the decision values having not been performed for a predetermined iteration count.

23. The method of claim 16, wherein the updating of the decision values of the variable nodes includes:

terminating the decoding operation based on a non-update flag and a determination that the updated decision values of the variable nodes are equal to decision values of the variable nodes before the updating operation is performed.

24. The method of claim 18, wherein updating of the size of the processing unit includes:

decreasing $I_m$ based on a determination that the number of the processed variable nodes is equal to a predetermined threshold.

* * * * *